United States Patent [19]
Tosaka et al.

[11] Patent Number: 6,096,490
[45] Date of Patent: Aug. 1, 2000

[54] SILVER HALIDE LIGHT SENSITIVE COLOR PHOTOGRAPHIC MATERIAL AND PROCESS FOR PREPARING COLOR PROOF

[75] Inventors: Yasuo Tosaka, Odawara; Yoshiyuki Nonaka, Hachioji, both of Japan

[73] Assignee: Konica Corporation, Tokyo, Japan

[21] Appl. No.: 09/210,486

[22] Filed: Dec. 11, 1998

[30] Foreign Application Priority Data

Dec. 17, 1997 [JP] Japan .................................... 9-364073

[51] Int. Cl.⁷ ............... G03C 1/79; G03C 1/91; G03C 7/38; G03C 5/16
[52] U.S. Cl. ............ 430/505; 430/358; 430/508; 430/536; 430/538; 430/944
[58] Field of Search .................. 430/358, 508, 430/536, 538, 503, 505, 944

[56] References Cited

U.S. PATENT DOCUMENTS

| | | | |
|---|---|---|---|
| 5,252,424 | 10/1993 | Sato et al. ................................ | 430/510 |
| 5,364,748 | 11/1994 | Yoneyama ............................... | 430/505 |
| 5,434,033 | 7/1995 | Kawai .................................... | 430/357 |
| 5,486,450 | 1/1996 | Tosaka et al. .......................... | 430/358 |

FOREIGN PATENT DOCUMENTS

| | | |
|---|---|---|
| 0 305 599 | 8/1989 | European Pat. Off. . |
| 0 585 062 A1 | 3/1994 | European Pat. Off. . |
| 0 653 673 A1 | 5/1995 | European Pat. Off. . |
| 0 675 404 A1 | 10/1995 | European Pat. Off. . |
| 0 723 192 A1 | 7/1996 | European Pat. Off. . |

OTHER PUBLICATIONS

Derwent Publications Ltd., Database WPI, Section CH. Week 9707, AN 97–068976, XP002096572 of JP 08 314081 A, Nov. 29, 1996.

Patent Abstracts of Japan, vol. 011, No. 233, Jul. 30, 1987 of JP 62 044735A, Feb. 26, 1987.

*Primary Examiner*—Richard L. Schilling
*Attorney, Agent, or Firm*—Frishauf, Holtz, Goodman, Langer & Chick, P.C.

[57] ABSTRACT

A silver halide light sensitive color photographic material is disclosed, comprising a reflective support having on one side of the support a hydrophilic colloid layer containing a white pigment and one or more silver halide emulsion layers, wherein at least one of the silver halide emulsion layers contains a silver halide emulsion having a spectral sensitivity maximum at a wavelength of 730 nm or more, and an average primary particle size of the white pigment being 0.30 $\mu$m or more.

9 Claims, No Drawings

SILVER HALIDE LIGHT SENSITIVE COLOR PHOTOGRAPHIC MATERIAL AND PROCESS FOR PREPARING COLOR PROOF

FIELD OF THE INVENTION

The present invention relates a silver halide light sensitive color photographic material suitable for preparing a proofing color image (a color proof) from images obtained by color separation and halftone dot image conversion, in color lithographic printing, and a process for preparing a color proof making use of the photographic material.

BACKGROUND OF THE INVENTION

In the process of color lithographic printing, as method for preparing a color proof from plural sheets of black-and-white halftone dot images obtained by color separation and halftone dot image conversion, the overlay method and the surprint method are conventionally known, which are methods of forming color images by the use of a photopolymer or a diazo compound.

The overlay method is advantageous in that it is very simple, HAS a low production cost and can be used only by overlaying four-color (subtractive primaries and black) film sheets. However, it is disadvantageous in that the overlaying of the film sheets causes a gloss, which gives a texture different from that of the print.

The surprint method is a method in which colored images are superposed on the same support. This method is known to include methods in which the colored images are obtained by toner development that utilize adhesive properties of a photopolymerizable material, as disclosed in U. S. Pat. Nos. 3,582,327, 3,607,264, and 3,620,726.

Another method is known in which transfer is made on a support by the use of a light sensitive coloring sheet, followed by exposure and development to form an image, and thereafter another coloring sheet is superposed thereon, followed by repetition of the same process to prepare a color proof, as disclosed in JP-B 47-27441 (herein, the term, JP-B means examined and published Japanese Patent) and JP-A 56-501217 (herein, the term, JP-A means unexamined and published Japanese Patent Application). Still another method is known in which, using light sensitive coloring sheets, corresponding color separation films are exposed and developed, and the resulting respective colored images are transferred and formed on the same support, as disclosed in JP-A 59-97140. As toners and as colorants for the coloring sheets, used to form these images, the same coloring materials as used in printing inks can be used. Because of this advantage, the resulting color proof displays a color tone resembling that of the print.

In these methods, however, images must be superposed and transferred in the process of preparing a color proof, and there are disadvantages that operation thereof takes a relatively long time and they result in a high production cost. As methods that have eliminated such disadvantages, a method of preparing a color proof by the use of a silver halide color photographic material provided on a white support is disclosed in JP-A 56-113139, 56-104335, 62-280746, 62-280747, 62-280748, 62-280749, 62-280750 and 62-280849. In the method, plural sheets of color-separated black-and-white halftone dot images, converted into halftone dot images which are color-separated from a color original, are successively photographically printed on a sheet of color photographic paper by contact printing or the like, followed by color development, and a color image formed of dyes imagewise produced from couplers upon the color development is used as a color proof. However, this technique has a problem that varying the dot percentage to make a color image resemble a print results in an unwanted density increase in the white background of the image, leading to unacceptable coloring of the background. This technique further has the disadvantage that an attempt to make a color image resemble the print results in an insufficiency in the density of black images such as text compared to that of the print and, on the other hand, any means taken to increase this density so as to make a black image such as text have a density resembling that of a print brings about a low resemblance of the print to the color image, making it difficult to satisfy both at the same time.

JP-A 1-260629, 61-233732 and 4-1632 disclose a silver halide color photographic material having four emulsion layers comprised of Y, M, C and Black layers which are different in spectral sensitivity from each other. However, there is described no method for solving the above problems with respect to the density increase of the white background when varying the dot percentage to resemble the print. JP-A 8-304960 discloses a silver halide photographic material containing a pigment having an average primary particle size of 0.25 $\mu$m or more. However, nothing is described therein, with respect to the density increase of the white background when varying the dot percentage to resemble the print. It is further described that the average primary particle size is preferably within the range of 0.26 to 0.30 $\mu$m and only titanium oxide having an average primary particle size of at most 0.28 $\mu$m is exemplified.

SUMMARY OF THE INVENTION

Accordingly, it is an object of the present invention to provide a silver halide color photographic material for use in color proofing whereby when a color proof is prepared using the photographic material from halftone dot image information obtained by color separation and halftone dot image conversion, a stable image can be obtained without producing a density increase in the white background even when varying the dot percentage to resemble a print, and to provide a process for preparing a color proof.

The above object of the present invention can be achieved by the following constitution:

(1) a silver halide light sensitive color photographic material comprising a reflective support comprising a base paper provided on each side thereof with a polyolefin resin coat layer having on one side of the support a hydrophilic colloid layer containing a white pigment and one or more silver halide emulsion layers, characterized in that at least one of the silver halide emulsion layers comprises a silver halide emulsion having a spectral sensitivity maximum at a wavelength of 730 rim or more, and an average primary particle size of the white pigment being 0.30 $\mu$m or more;

(2) the silver halide light sensitive color photographic material comprising a reflective support comprising a base paper provided on each side thereof with a polyolefin resin coat layer having on one side of the support a hydrophilic colloidal layer containing a white pigment and one or more silver halide emulsion layers described in above (1), wherein a reflection density of the photographic material is 1.0 or more at a wavelength of the spectral sensitivity maximum of the silver halide emulsion contained in at least one of the silver halide emulsion layers;

(3) the silver halide light sensitive color photographic material comprising a reflective support comprising a base paper provided on each side thereof with a polyolefin resin coat layer having on one side of the support a hydrophilic colloidal layer containing a white pigment and one or more silver halide emulsion layers described in (1) or (2), wherein the silver halide photographic material comprises a silver halide emulsion used for forming a yellow image, a silver halide emulsion used for forming a magenta image, a silver halide emulsion used for forming a cyan image and a silver halide emulsion used for forming a black image;

(4) the silver halide light sensitive color photographic material comprising a reflective support comprising a base paper provided on each side thereof with a polyolefin resin coat layer having on one side of the support a hydrophilic colloidal layer containing a white pigment and one or more silver halide emulsion layers described in any one of above (1) to (3), wherein at least one of the silver halide emulsion layers comprises a compound represented by the following formulas [I] to [IV]:

Formula [I]

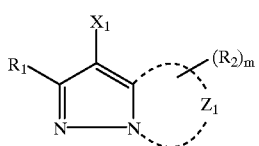

Formula [II]

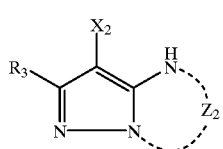

Formula [III]

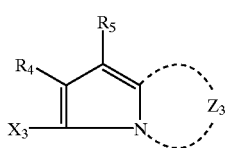

Formula [IV]

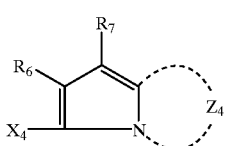

wherein $R_1$ represents a hydrogen atom or a substituent, $R_2$ represents a substituent, m represents the number of the substituent $R_2$ (i.e., m is preferably 0 or an integer of 1 to 3), provided that when m is 0, $R_1$ is an electron-withdrawing group having a Hammett's substituent constant σp of 0.20 or more and when m is 1, or 2 or more, at least one of $R_1$ and $R_2$ is an electron-withdrawing group having a Hammett's substituent constant σp of 0.20 or more, $Z_1$ represents a non-metallic atom group necessary for forming a nitrogen-containing 5-membered heterocyclic ring;

$R_3$ represents a hydrogen atom or a substituent; $Z_2$ represents a non-metallic atom group necessary for forming a nitrogen-containing 6-membered heterocyclic ring with —NH— through condensing with the pyrazole ring;

$R_4$ and $R_5$ each represent an electron-withdrawing group having a Hammett's substituent constant σp of 0.20 or more, provided that a sum of σp values of $R_4$ and $R_5$ is 0.65 or more, and $Z_3$ represents a non-metallic atom group necessary for forming a nitrogen-containing 5-membered heterocyclic ring;

$R_6$ and $R_7$ each represent a hydrogen atom or a substituent, $Z_4$ represents a non-metallic atom group necessary for forming a nitrogen-containing 6-membered heterocyclic ring; and $X_1$, $X_2$, $X_3$ and $X_4$ each represent a hydrogen atom or a group capable of being released upon coupling reaction with an oxidation product of a color developing agent; and (5) a process for preparing a color proof by a process comprising
  subjecting a silver halide light sensitive color photographic material to exposure based on color-separated yellow image information, magenta image information, cyan image information and black image information and
  further subjecting to processing to form an yellow image component, a magenta image component, a cyan image component and a black image component, wherein the silver halide color photographic material is the one described in any one of (1) to (4) described above.

DETAILED DESCRIPTION OF THE INVENTION

Examples of white pigments used in the present invention include rutile type titanium dioxide, anatase type titanium dioxide, barium sulfate, barium stearate, silica, alumina, zirconium oxide, and kaolin. Of these, titanium dioxide is preferred for various reasons. The white pigment is preferably dispersed in a water soluble binder of hydrophilic colloid such as gelatin into which the processing solution is permeable. The coating amount of the white pigment is preferably 0.1 to 50 g/m², and more preferably 0.2 to 10 g/m². The average primary particle size of the white pigment is preferably 0.30 to 3.0 μm, more preferably 0.32 to 2.0 μm, and still more preferably 0.32 to 1.0 μm. The average primary particle size is referred to as a cubic root of a particle volume corresponding to the maximum value of the product of the particle volume and its frequency, when particles of the white pigment are observed with an electron microscope. The white pigment can be used singly or in the form of a mixture of plural and different kinds of white pigments. In cases where plural white pigments different in average particle size are used, the average primary particle size of the mixture shall preferably be 0.30 μm or more, and the average particle size of any one of white pigments before being mixed may be 0.30 μm or more.

A hydrophilic colloid layer containing the white pigment relating to the invention is preferably provided between a support and a silver halide emulsion layer nearest to the support. Between the support and the silver halide emulsion layer nearest to the support, a light insensitive hydrophilic colloid layer other than the white pigment containing layer can optionally be provided, including a sublayer coated on the support and an interlayer provided at an arbitrary position. The hydrophilic colloid layer containing the white pigment preferably further contains a light absorbing material capable of preventing halation due to the support or white pigment, in terms of enhancement of sharpness. The white pigment can be contained separately from the layer containing colloidal silver, a water soluble dyestuff or its solid particle dispersion, which is advantageous in terms of sensitivity.

The silver halide color photographic material according to the invention preferably comprises inclusion of a silver halide emulsion having a spectral sensitivity maximum at a wavelength of 730 nm or more. The silver halide emulsion having a spectral sensitivity maximum at a wavelength of 730 nm or more can be obtained by selectively employing sensitizing dye(s) known in the art. The silver halide emulsion having a sensitivity maximum at a wavelength of 730 nm or more is preferably included in a silver halide emulsion layer nearest to the support. The color photographic material according to the invention comprises one or more silver halide emulsion layers. Among the silver halide emulsion layers, the emulsion layer containing the silver halide emulsion having a sensitivity maximum at a wavelength of 730 nm or more is preferably provided closest to the support.

The silver halide color photographic material according to the invention preferably comprises at least a yellow image forming silver halide emulsion layer, a magenta image forming silver halide emulsion layer and a cyan image forming silver halide emulsion layer. Silver halide emulsions contained in these emulsion layers each have a spectral sensitivity maximum at different wavelengths from each other. Each of the wavelengths of the spectral sensitivity maximum is preferably separated from the other by 20 nm or more.

The color photographic material according to the invention, which has not been processed, preferably has a reflection density of at least one of the wavelengths of spectral sensitivity maximum of the silver halide emulsion (s) contained in the silver halide emulsion layer(s). The reflection density, i.e., the reflection density at the emulsion side of the photographic material can be measured by any of several methods known in the art. For example, there can be used a spectral reflection density value obtained by measuring reflectiondensities at the emulsion side of the photographic material using Color Analyzer 607 available from Hitachi Seisakusho. A means for making the reflection density 1.0 or more is preferably incorporation of a water soluble dyestuff having absorption within the spectral sensitivity range of the silver halide emulsion and/or to provide an antihalation in the lowest layer or another layer. Further, the dyestuff is preferably incorporated in the form of a solid particle dispersion to prevent the dyestuff from diffusing within the photographic material.

Examples of the water soluble dyestuff usable in the present invention include those of oxonol, cyanine, merocyanine, azo, anthraquinone, and allylidene. Of these, an oxonol dyestuff and merocyanine dyestuff are preferred in terms of high degradability on processing and having no sensitizing ability to silver halide. The oxonol dyestuff is described in U.S. Pat. No. 4,187,225; and JP-A 48-42826, 49-5125, 49-99620, 50-91627, 51-77327, 55-120660, 58-24139, 58-143342, 59-38742, 59-111640, 59-111641, 59-168438, 60-218641, 62-31916, 62-66275, 62-66276, 62-185755, 62-273527 and 63-139949. The merocyanine dyestuff is described in JP-A 50-145124, 58-120245, 63-34537, 63-34538, 63-34539, and 63-58437.

Exemplary examples of the oxonol dyestuff and merocyanine dyestuff include water soluble yellow dyestuffs AIY-1 to AIY-14, water soluble magenta dyestuffs AIM-1 to AIM-14 and water soluble cyan dyestuffs AIC-1 to AIC-14, as described in Japanese Patent Application No. 7-150291. Exemplary examples of water soluble dyestuffs other than the oxonol dyestuff and merocyanine dyestuff include water soluble yellow dyestuffs AIY-15 to AIY-18, water soluble magenta dyestuffs AIM-15 to AIM-18 and water soluble cyan dyestuffs AIC-15 to AIC-18, as described in Japanese Patent Application No. 7-150291. Furthermore, the water soluble dyestuff usable in the invention include dyestuffs A-1 to A-43 described in JP-A 4-330437. The water soluble dyestuff is incorporated in an amount giving 1.0 or more of the reflection density, which is measured at the wavelength of the spectral sensitivity maximum of the emulsion included in the unprocessed photographic material. The water soluble dyestuff can be incorporated singly or in combinations thereof.

The antihalation layer can be provided in the lowest layer or any other layer. The antihalation layer contains a light-absorbing compound. The light-absorbing compound includes a variety of light-absorbing organic compounds and inorganic compounds. Suitable inorganic compounds include colloidal silver and colloidal manganese, of which colloidal silver is specifically preferred. These colloid-formed metals are superior in decolorizability and advatageously employed in the color photographic material according to the invention. The colloidal silver, e.g., black colloidal silver can be obtained by a process in which silver nitrate is reduced, in gelatin, in the presence of a reducing agent such as hydroquinone, phenidone, ascorbic acid, pyrogallol or dextrin, while being maintained at specific alkalinity, followed by being neutralized, cooled, set and subjected to noodle washing to remove the reducing agent and unnecessary soluble salts. When reduced in alkalinity in the presence of an azaindene compound or a mercapto compound to prepare colloidal silver particles, a colloidal silver dispersion comprised of homogeneous particles can be obtained. The coverage of the colloidal silver can optionally be selected so as to give 1.0 or more of the reflection density measured at 730 nm of the unprocessed photographic material. In cases where is used in combination with other water soluble dyestuff(s), the reflection density of the unprocessed photographic material is preferably to be 1.0 or more.

The color photographic material according to the invention can contain a dyestuff having at least one of a carboxy group, sufonamido group and sulfamoyl group in the form of a solid particle dispersion, in a silver halide emulsion layer and/or other hydrophilic colloid layer.

Examples of the dyestuff having at least one of a carboxy group, sufonamido group and sulfamoyl group include exemplified dyestuffs 1-1 to 8-7 described in Japanese Patent Application No. 7-150291. The dyestuff having at -Least one of a carboxy group, sufonamido group and sulfamoyl group is substantially insoluble in water (i.e., water at a pH of 7 or less), having a hydrophilic group which is capable of being dissociated at a pH of 9 or more. The dyestuff, which is made to be present in gelatin or a polymeric binder, in the form of a fine solid particle dispersion (i.e., solid particles having microscopic dimension and preferably an average particle size of 10 $\mu$m or less, and more preferably 1 $\mu$m or less) obtained by means of a technique of pulverizing with a ball mill or a sand mill or a technique of dissolving in an organic solvent and dispersing in a gelatin solution, can be incorporated into any one of photographic component layers including a light sensitive emulsion layer and a hydrophilic colloid layer. The fine solid particle dispersion of the dyestuff having at least one of a carboxy group, sufonamido group and sulfamoyl group can be stably present, in a water-insoluble form, in the color photographic material, and almost disappears by being subjected, after exposure, to processing with a color developing solution (preferably at a pH of 9 or more). The dyestuff having at least one of a carboxy group, sufonamido group and sulfamoyl group may be used in combination thereof or in combination with a water soluble dyestuff or colloidal silver. The dyestuff having at least one of a carboxy group, sufonamido group and sulfamoyl group can be incorporated by appropriately selecting the content so as to give 1.0 or more of a reflection density measured at a wavelength of the spectral sensitivity maximum of at least one of the emulsions included in the unprocessed color photographic material according to the invention. In cases where incorporated in combination with another water soluble dyestuff, the reflection density of the unprocessed photographic material is to be 1.0 or more. The amount to be incorporated is generally in the range of 0.001 to 0.5 $g/m^2$.

In one preferred embodiment of the present invention, the silver halide color photographic material comprises inclusion of a yellow image forming silver halide emulsion layer, a magenta image forming silver halide emulsion layer and a cyan image forming silver halide emulsion layer. In another preferred embodiment of the invention, the silver halide color photographic material further includes a black image forming silver halide emulsion layer, in addition to the yellow image forming silver halide emulsion layer, magenta image forming silver halide emulsion layer and cyan image forming silver halide emulsion layer. The black image forming silver halide emulsion may be one which can singly form a black image. Alternatively, the black image forming silver halide emulsion may be one which is designed so as to give a neutral, black image with a sufficient density through exposure and development of a black image forming silver halide emulsion, in addition to an image formed upon development of at least a part of the yellow image forming silver halide emulsion, magenta image forming silver halide emulsion and cyan image forming silver halide emulsion. In one preferred embodiment thereof, the yellow image forming layer contains a yellow image forming silver halide emulsion, the magenta image forming layer containing a magenta image forming silver halide emulsion, the cyan image forming layer containing a cyan image forming silver halide emulsion, and the black image forming layer containing a black image forming silver halide emulsion. In this case, as a silver halide emulsion contained in each image forming layer are employed four kinds of silver halide emulsions which are different in the wavelength at the spectral sensitivity maximum from each other. The spectral sensitivity of each emulsion can be arbitrarily selected. A preferred combination is comprised of a blue-sensitive emulsion, a green-sensitive emulsion, a red-sensitive emulsion and infrared-sensitive emulsion. Another preferred combination is comprised of a green-sensitive emulsion, a red-sensitive emulsion, an infrared-sensitive emulsion 1 and an infrared-sensitive emulsion 2 (which is different in its wavelength of the spectral sensitivity maximum from the infrared-sensitive emulsion 1). However, embodiments of the invention are not limited to these.

Combinations of the wavelength of the spectral sensitivity maximum of the emulsion with an image forming layer is optional, and preferred examples thereof include the following combinations. Thus, when the term, Y-Em, M-Em, C-Em and K-Em represent a yellow image forming emulsion, a magenta image forming emulsion, a cyan image forming emulsion and a black image forming emulsion, respectively, and the trm, B-Em, G-Em, R-Em and IR-Em represent a blue-sensitive emulsion, a green-sensitive emulsion, a red-sensitive emulsion and an infrared-sensitive emulsion, respectively; each of the image forming layers can be formed by the combination of these emulsions, as shown below.

| No. | B-Em | G-Em | R-Em | IR-Em |
|---|---|---|---|---|
| 1 | Y-Em | M-Em | C-Em | K-Em |
| 2 | Y-Em | M-Em | K-Em | C-Em |
| 3 | Y-Em | C-Em | M-Em | K-Em |
| 4 | Y-Em | C-Em | K-Em | M-Em |
| 5 | Y-Em | K-Em | M-Em | C-Em |
| 6 | Y-Em | K-Em | C-Em | M-Em |
| 7 | M-Em | C-Em | K-Em | Y-Em |
| 8 | M-Em | C-Em | Y-Em | K-Em |
| 9 | M-Em | K-Em | Y-Em | C-Em |
| 10 | M-Em | K-Em | C-Em | Y-Em |
| 11 | M-Em | Y-Em | C-Em | K-Em |
| 12 | M-Em | Y-Em | K-Em | C-Em |
| 13 | C-Em | K-Em | Y-Em | M-Em |
| 14 | C-Em | K-Em | M-Em | Y-Em |
| 15 | C-Em | Y-Em | M-Em | K-Em |
| 16 | C-Em | Y-Em | K-Em | M-Em |
| 17 | C-Em | M-Em | Y-Em | K-Em |
| 18 | C-Em | M-Em | K-Em | Y-Em |
| 19 | K-Em | Y-Em | M-Em | C-Em |
| 20 | K-Em | Y-Em | C-Em | M-Em |
| 21 | K-Em | M-Em | Y-Em | C-Em |
| 22 | K-Em | M-Em | C-Em | Y-Em |
| 23 | K-Em | C-Em | Y-Em | M-Em |
| 24 | K-Em | C-Em | M-Em | Y-Em |

In No. 1 described above, for example, combinations of each of blue-sensitive, green-sensitive, red-sensitive and infrared-sensitive emulsions with yellow, mgenta, cyan and black image forming layers, respectively, form a blue-sensitive yellow image forming layer, a green-sensitive magenta image forming layer, a red-sensitive cyan image forming layer and a infrared-sensitive black image forming layer.

In the above combinations, blue-sensitive, green-sensitive, red-sensitive and infrared-sensitive emulsions are employed. In addition thereto, the use of an emulsion having a spectral sensitivity maximum other than the above can be combined with the image forming layer. For example, the above-described combination can be replaced by another combination of four emulsion which are different in their spectral sensitivity maximum wavelength, such as a combination of a green-sensitive, red-sensitive, infrared-sensitive (1) and infrared-sensitive (2) emulsions.

The black image forming emulsion is preferably combined with the black image forming layer. Alternatively, the black image forming emulsion is allowed to be contained in plural image forming layers to form a black image upon exposure and development. In one embodiment, a black image forming emulsion is allowed to be contained in a cyan image forming layer and a red image forming layer, followed by black-imagewise exposure and development to concurrently form cyan and red images, leading to black image formation. In this case, a cyan image forming emulsion can be contained concurrently in the cyan image forming layer, i.e., a cyan coupler can be used both for cyan image formation and for black image formation. In the red image forming layer are preferably contained a yellow coupler and a magenta coupler. In another embodiment, a black image forming emulsion is allowed to be contained in a magenta image forming layer and a green image forming layer, followed by black-imagewise exposure and development to concurrently form magenta and green images, leading to black image formation. In this case, a magenta image forming emulsion can be contained concurrently in the magenta image forming layer, i.e., a magenta coupler can be used both for magenta image formation and for black image formation. In the green image forming layer are preferably contained a yellow coupler and a cyan coupler. In still another embodiment, a black image forming emulsion is allowed to be contained in a yellow image forming layer and a blue image forming layer, followed by black-imagewise exposure and development to concurrently form yellow and blue images, leading to black image formation. In this case, a yellow image forming emulsion can be contained concurrently in the yellow image forming layer, i.e., a yellow coupler can be used both for yellow image formation and for black image formation. In the blue image forming layer are preferably contained a magenta coupler and a cyan coupler.

A preferred method for allowing the black image forming emulsion to be contained in plural image forming layers is shown below. In layer constitution No. 10 described above, for example, some examples of layer arrangement are shown below.

| Image Forming Layer | Emulsion contained |
| --- | --- |
| Magenta image forming layer | B-Em |
| Red image forming layer | G-Em |
| Cyan image forming layer | R-Em + G-Em |
| Yellow image forming layer | IR-Em |
| Magenta image forming layer | B-Em + G-Em |
| Green image forming layer | G-Em |
| Cyan image forming layer | R-Em |
| Yellow image forming layer | IR-Em |
| Magenta image forming layer | B-Em |
| Blue image forming layer | G-Em |
| Cyan image forming layer | R-Em |
| Yellow image forming layer | IR-Em + G-Em |
| Magenta image forming layer 1 | B-Em |
| Magenta image forming layer 2 | G-Em |
| Cyan image forming layer | R-Em + G-Em |
| Yellow image forming layer | IR-Em + G-Em |
| Magenta image forming layer | B-Em + G-Em |
| Cyan image forming layer 1 | G-Em |
| Cyan image forming layer 2 | R-Em |
| yellow image forming layer | IR-Em + G-Em |
| Magenta image forming layer | B-Em + G-Em |
| Yellow image forming layer 1 | G-Em |
| Cyan image forming layer | R-Em + G-Em |
| Yellow image forming layer 2 | IR-Em |
| Magenta image forming layer | B-Em + G-Em |
| Cyan image forming layer | R-Em + G-Em |
| Yellow image forming layer | IR-Em + G-Em |

In the layer constitution other than Layer Constitution No. 10 described above, similarly, the black image forming emulsion can concurrently be contained in plural image forming layers to obtain a black image. Combinations of emulsions having other spectral sensitivity maximum wavelengths can be similarly constituted. The coating order of emulsion layers from the side nearest to the support can be rather arbitrary selected. Each emulsion layer, e.g., the magenta image forming layer may be formed of a single layer or plural layers.

The silver halide emulsion relating to the invention can be spectrally sensitized with a spectral-sensitizing dye selected from dyes known in the art.

Cyan couplers usable in the invention are preferably a polycyclic hetero-ring compounds formed by condensing with a nitrogen atom contained in a pyrrole ring or pyrazole ring. Of these, the cyan couplers are represented by formulas [I] to [IV] afore-mentioned.

In formula [I], $R_1$ represents a hydrogen atom or a substituent, $R_2$ represents a substituent, m represents the number of the substituent $R_2$ (i.e., m is preferably 0 or an integer of 1 to 3), provided that when m is 0, $R_1$ is an electron-withdrawing group having a Hammett's substituent constant σp of 0.20 or more and when m is 1, or 2 or more, at least one of $R_1$ and $R_2$ is an electron-withdrawing group having a Hammett's substituent constant σp of 0.20 or more. Examples of the electron-with drawing group having a Hammett's substituent constant σp of 0.20 or more include sulfonyl, sulfinyl, sulfonyloxy, sulfamoyl, phospholyl, carbamoyl, acyl, acyloxy, oxycarbonyl, carboxyl, cyano, nitro, halogenated alkoxy, halogenated aryloxy, pyrrolyl and tetrazolyl groups an a halogen atom. Examples of the sulfonyl group include alkyl sulfonyl, arylsulfonyl, halogenated alkylsulfonyl and halogenated arylsulfonyl groups; examples of the sulfinyl group include alkylsulfinyl and arylsulfinyl groups; examples of the sulfonyloxy group include alkylsulfonyloxy and arylsulfonyloxy groups; examples of the sulfamoyl group include N,N-dialkylsulfamoyl, N,N-diarylsulfamoyl, and N-alkyl-N-arylsulfamoyl groups; examples of the phosphoryl group include alkoxyphosphoryl, aryloxyphosphoryl and arylphosphryl groups; examples of the carbamoyl group include N,N-dialkylcarbamoyl, N,N-diarylcarbamoyl, and N-alkyl-N-arylcarbamoyl groups; examples of the acyl group include alkylcarbonyl and arylcarbonyl groups; examples of the acyloxy group include an alkylcarbonyloxy group; and examples of the oxycarbonyl group include alkoxycarbonyl and aryloxycarbonyl groups. An example of the halogenated alkoxy group includes α-halogenoalkoxy; and examples of the halogenated aryloxy group include tetrafluoroaryloxy and pentafluoroaryloxy groups. Examples of the pyrrolyl and tetrazolyl groups include 1-pyrrolyl and 1-tetrazolyl groups, respectively. In addition to the above groups, trifluoromethyl, heptafluoro-i-propyl, nonylfluoro-t-butyl groups and tetrafluoroaryl and pentafluoroaryl groups aree also preferred.

As a substituent represented by $R_1$ and $R_2$, other than the electron-withdrawing groups described above, various groups are cited and they are not specifically lomited. Representative examples thereof include alkyl, aryl, anilino, acylamino, sulfonamido, alkylthio, arylthio, alkenyl, cycloalkyl, cycloalkenyl, alkynyl, heterocyclic, alkoxy, aryloxy, hetrocyclic-oxy, siloxy, amino, alkylamino, imido, ureido, sulfamoylamino, alkoxycarbonylamino, aryloxycarbonylamino, alkoxycarbonyl, aryloxycarbonyl, heterocyclic-thio, thioureido, hydroxy and mercapto groups, spiro-compound residue and bridged hydrocarbon compound residue. The alkyl group preferably has 1 to 32 carbon atoms, which may be stretch chained or brnched. The aryl group is preferablt a phenyl group. Examples of the acylamino group include alkylcarbonylamino and arylcarbonylamino groups; and examples of the sulfonamido group include alkylsulfonylamino and arylsulfonylamino groups. Alkyl and aryl components of the alkylthio and arylthio groups include the alkyl group and aryl group described above. The alkenyl group preferably has 2 to 32 carbon atoms, and the cycloalkyl group preferably has 3 to 12 carbon atoms, and more preferably 5 to 7 carbon atoms. The alkenyl group may be stretch-chained or brached. The cycloalkenyl group preferably has 3 to 12 carbon atoms, and more preferably 5 to 7 carbon atoms. Examples of the ureido group include alkyl ureido and arylureido groups; examples of the the sulfamoylamino group include alkylsulfamoylamino and arylsulfamoylamino groups; the hetrerocyclic group is preferably the one having 5 to 7 carbon atoms, and examples thereof include 2-furyl, 2-thienyl, 2-pyrimidinyl and 2-benzothiazolyl; the heterocyclic-oxy group is preferably 5- to 7-membered ring, and examples thereof include 3,4,5,6-tetrahydropyranyl-2-oxy and 1-phenyltetrazole-5-oxy; examples of the siloxy group include trimethylsiloxy, triethylsiloxy and dimethylbutylsiloxy; and examples of the imido group include 3-heptadecylsucciimido, phthalimido and glutarimido groups. The spiro compound residue includes spiro[3.3]heptane-1-yl; and examples of the bridged hydrocarbon compound residue include bicyclo[2.2.1]heptane-1-yl, tricyclo[3.1.1$^{3.7}$]decane-1-yl and 7,7-dimethyl-bicyclo[2.2.1]heptane-1-yl. $Z_1$ represents a non-metallic atom group necessary for forming a nitrogen-containing 5-membered heterocyclic ring;

$R_3$ represents a hydrogen atom or a substituent; $Z_2$ represents a non-metallic atom group necessary for forming a nitrogen-containing 6-membered heterocyclic ring with —NH— through condensing with the pyrazole ring;

$R_4$ and $R_5$ each represent an electron-withdrawing group having a Hammett's substituent constant σp of 0.20 or more, provided that a sum of up values of $R_4$ and $R_5$ is 0.65 or more, and $Z_3$ represents a non-metallic atom group necessary for forming a nitrogen-containing 5-membered heterocyclic ring;

$R_6$ and $R_7$ each represent a hydrogen atom or a substituent, $Z_4$ represents a non-metallic atom group necessary for forming a nitrogen-containing 6-membered heterocyclic ring; and $X_1$, $X_2$, $X_3$ and $X_4$ each represent a hydrogen atom or a group capable of being released upon coupling reaction with an oxidation product of a color developing agent.

Exemplary examples of the cyan couplers represented by formulas [I] to [IV] include Compounds C-1 to C-44 described in Japanese Patent Application No. 6-47243, and compound C-45, as shown below.

C-1
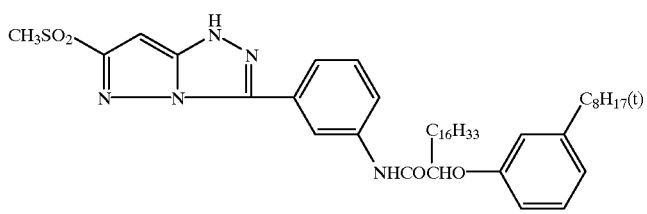

C-2
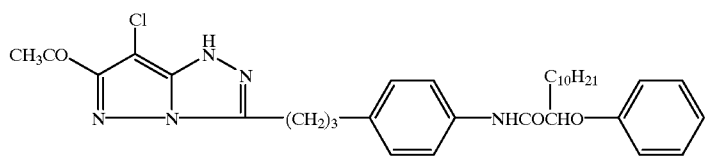

C-3
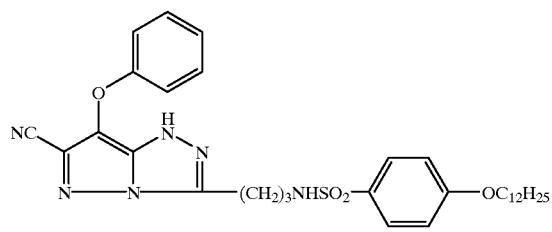

C-4
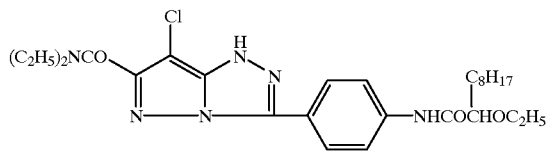

C-5
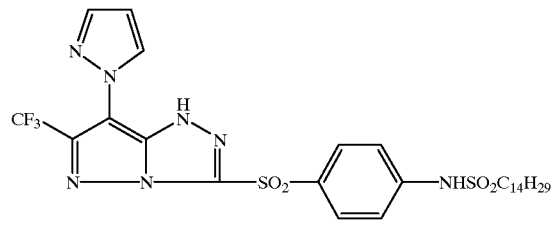

C-6
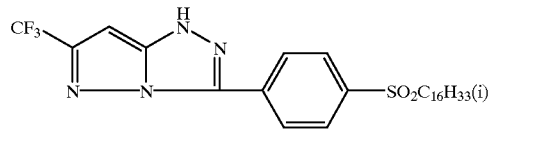

C-7
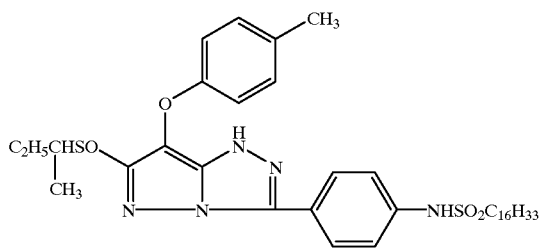

-continued
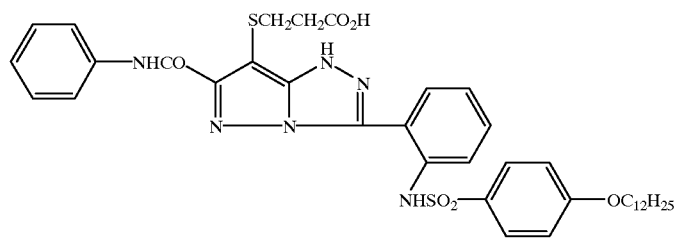
C-8
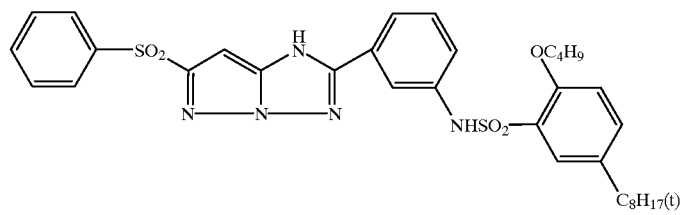
C-9
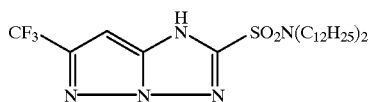
C-10
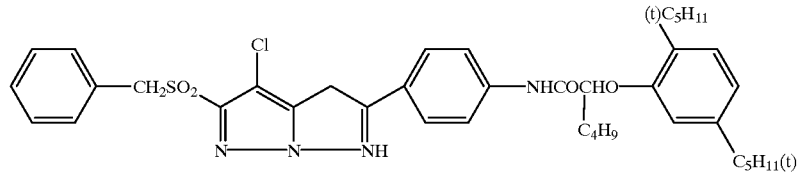
C-11
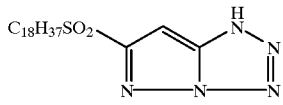
C-12
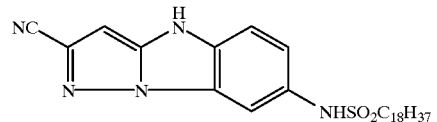
C-13
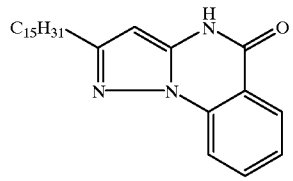
C-14
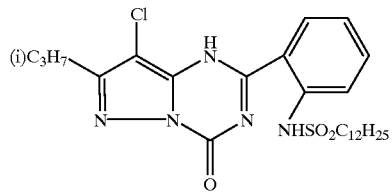
C-15
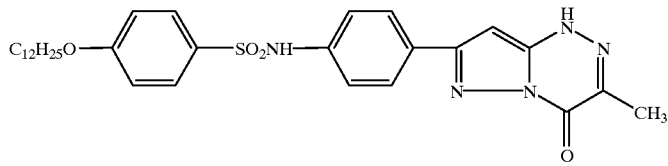
C-16
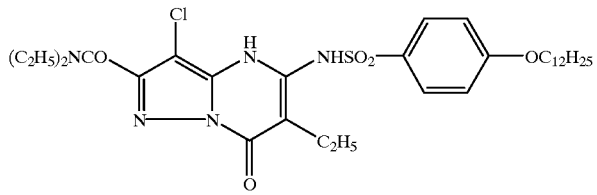
C-17

-continued
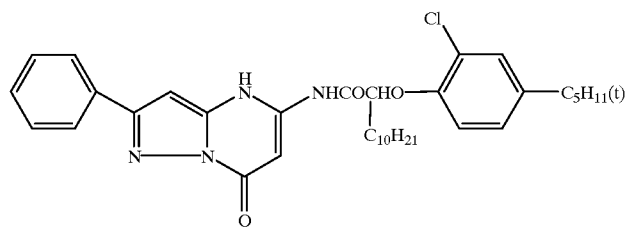
C-18
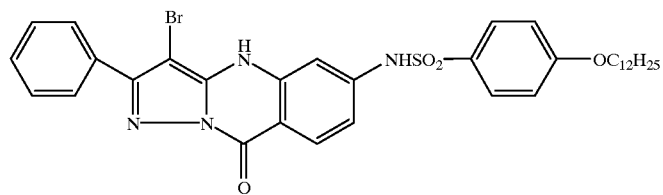
C-19
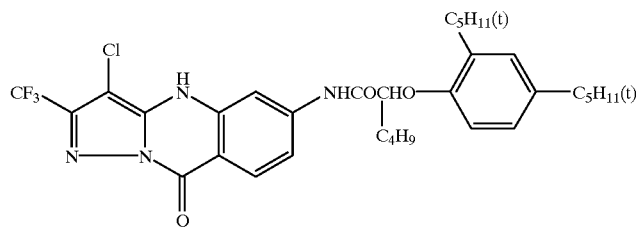
C-20
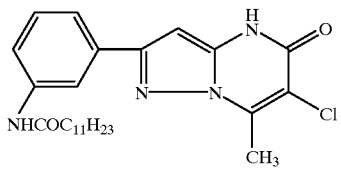
C-21
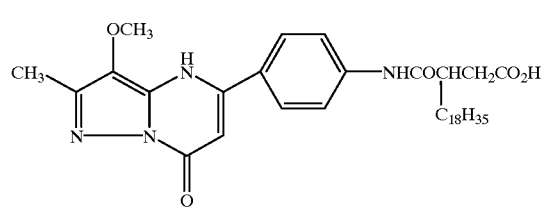
C-22
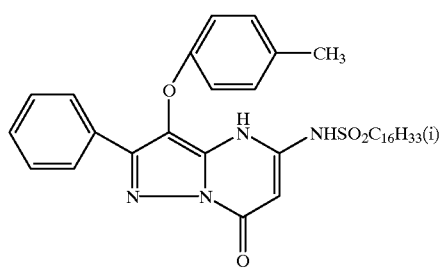
C-23
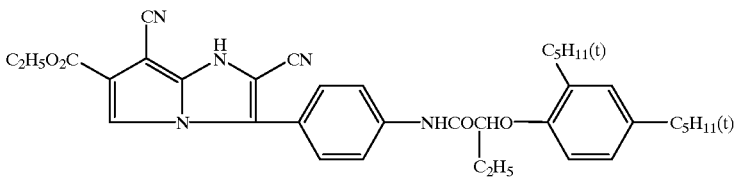
C-24

-continued
C-25
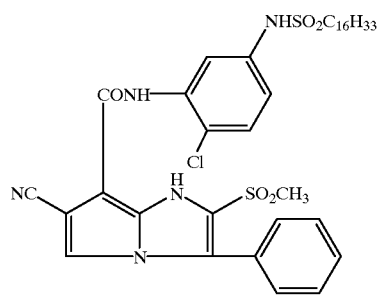
C-26
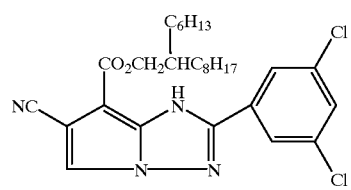
C-27
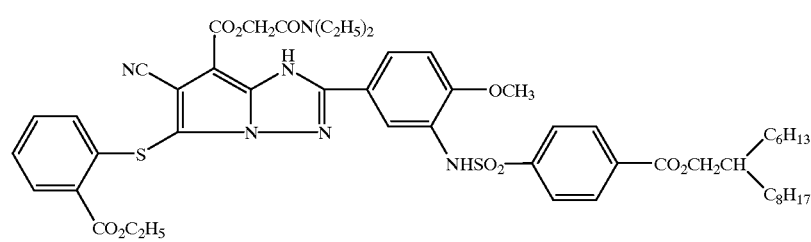
C-28
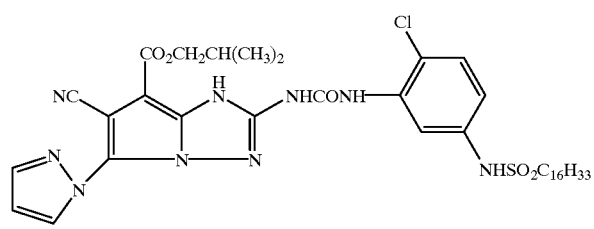
C-29
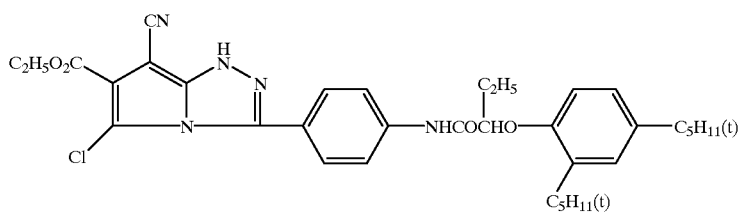
C-30
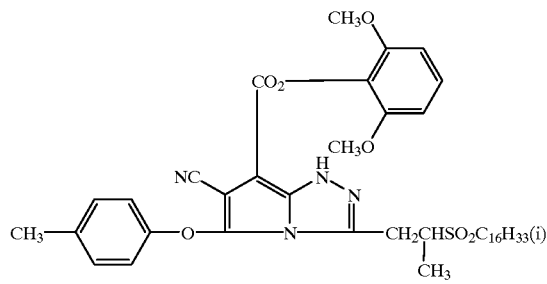
C-31
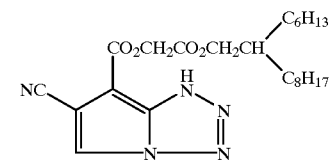
C-32
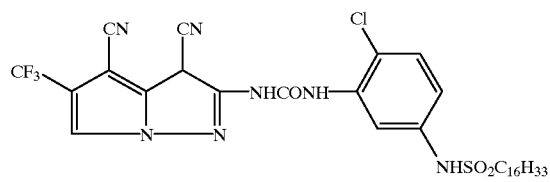
C-33
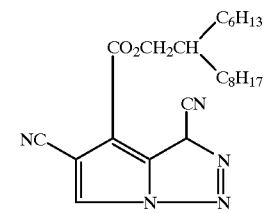

-continued
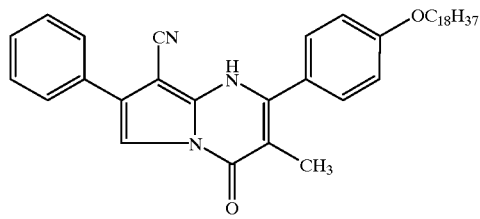
C-34
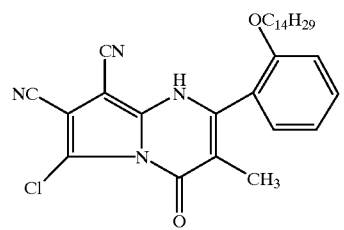
C-35
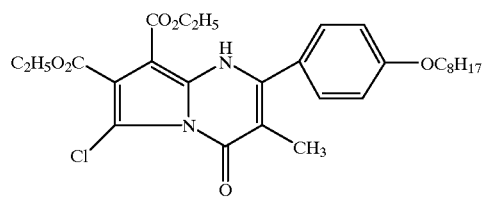
C-36
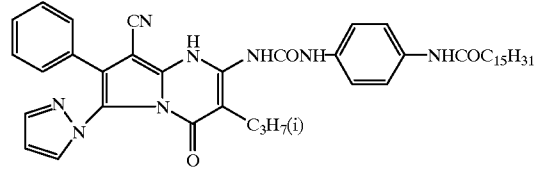
C-37
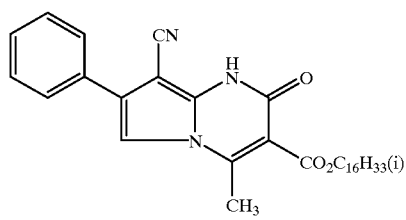
C-38
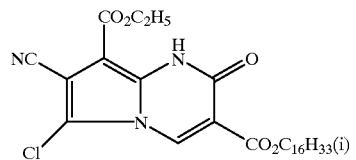
C-39
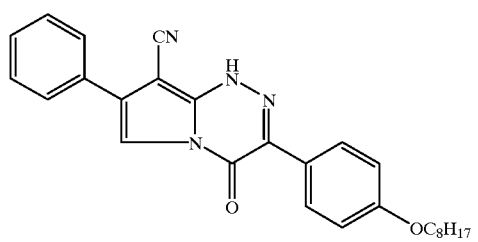
C-40
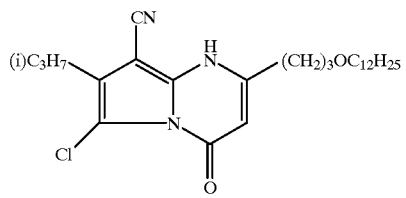
C-41
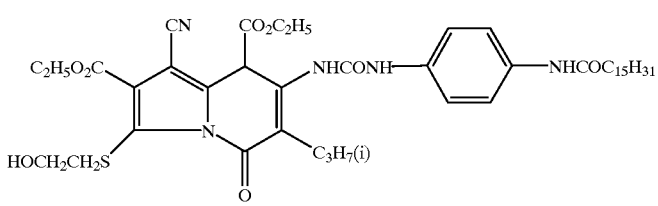
C-42
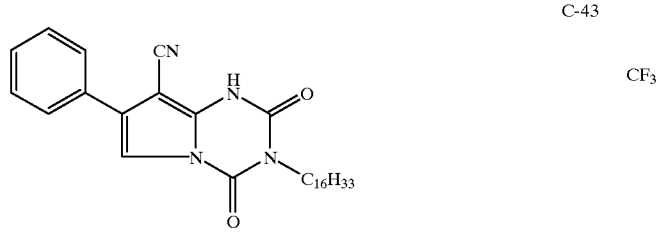
C-43
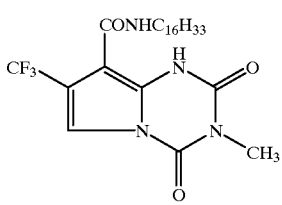
C-44
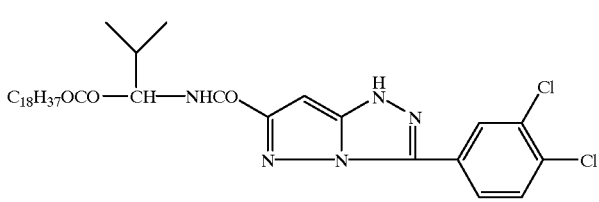
C-45

The silver halide color photographic material according to the invention preferably contains, in its component layer, a brightening compound, in the form of a solid particle dispersion.

The brightening compound is preferably substantially water-insoluble compound exhibiting brightening effect. Any type of a compound, which is substantially water-insoluble and exhibits brightening effect at ordinary temperatures, can employed. Herein, the expression "substantially water-insoluble" means solubility at 25° C. being 1.0 g or less per 100 g of water. As the substantially water-insoluble, brightening compound, a water-insoluble brightening agent conventionally known cab be employed. Specifically, a substantially water-insoluble organic salt represented by the following formula [V] can be preferably employed, and a substantially water-insoluble organic salt represented by the following formula [VI] can be further preferably employed.

A·[B]n          Formula [V]

wherein A represents a brightening agent moiety containing an anionic group such as carboxyl group; B represents a cation having total carbon atoms of 15 or more, such as ammonium or pyridium; and n is an integer of 1 to 9. Preferred examples of the brightening agent moiety containing an anionic group include a substituted stilbene type brightening agent, substituted coumarin type brightening agent and substituted thiophene type brightening agent.

C·[D]n          Formula [VI]

wherein C represents a brightening agent moiety containing a sulfonic acid group; D represents a cation having total carbon atoms of 15 or more, such as ammonium or pyridinium; and n is an integer of 1 to 9. Preferred examples of the brightening agent moiety containing a sulfonic acid group include a sulfonic acid group-containing, substituted stilbene type brightening agent, substituted coumarin type brightening agent and substituted thiophene type brightening agent.

The brightening agent moiety represented by "A" of the formula [V] or "B" of the formula [VI] can be readily synthesized by reference to, e.g., "Keikozohakuzai" (Brightening Agent) edited by Kaseihin Kogyokai; British patent No. 920,988; German Patent No. 1,065,838; and U.S. Pat. No. 2,610,152. The compound represented by formula [V] or [VI] can be readily synthesized by mixing the brightening corresponding to the A of formula [V] or the C of formula [VI] with an organic cation having total carbon atoms of 15 or more, such as ammonium or pyridium and corresponding to the B of formula [V] or the D of formula [VI}. The organic cation is preferably an ammonium ion having 15 or more carbon atoms in total. Example of the substantially water-insoluble brightening compound preferably used in the invention are shown below, but the compound is not limited to these examples.

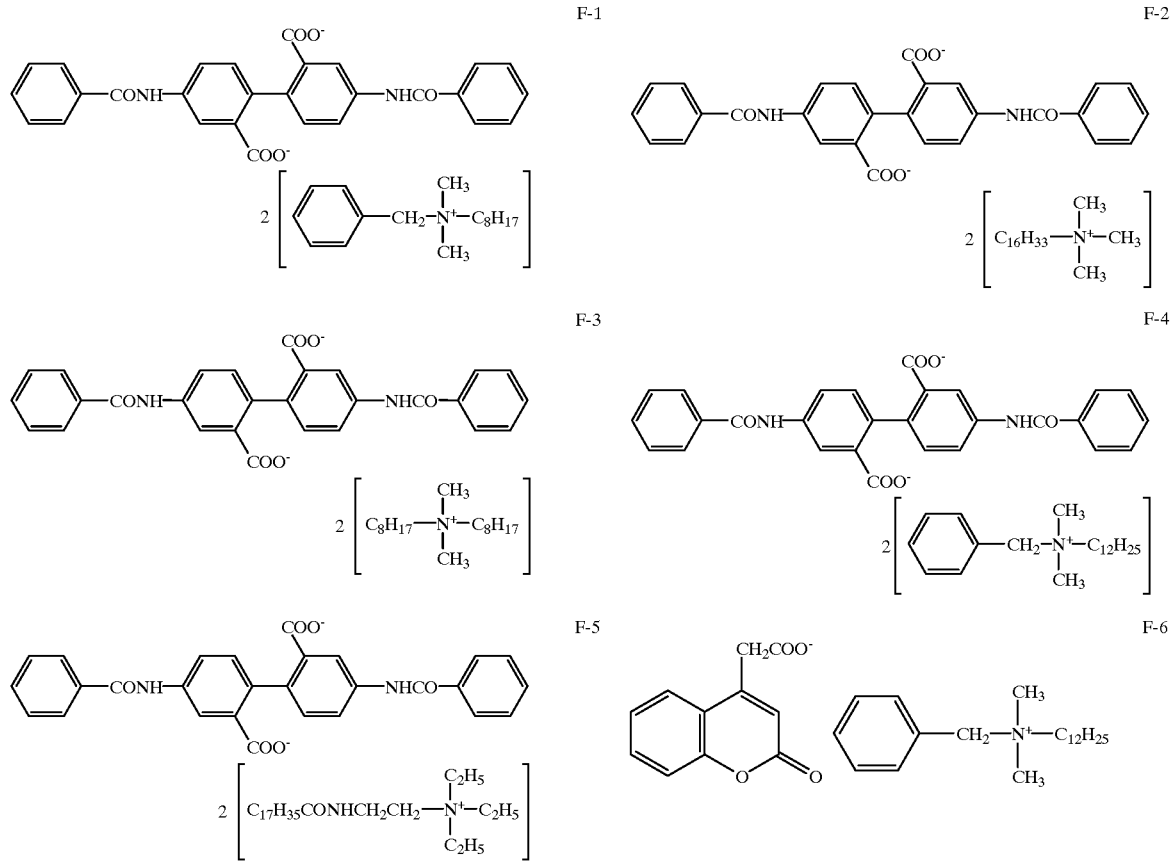

F-7
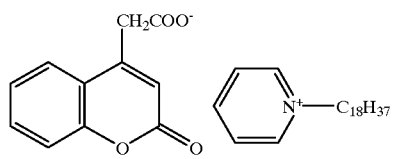
F-8
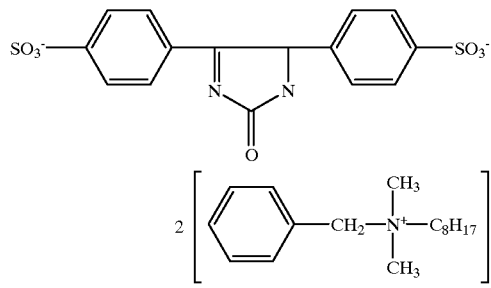
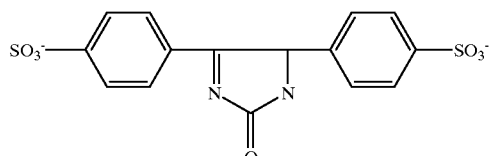
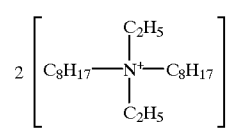
F-9
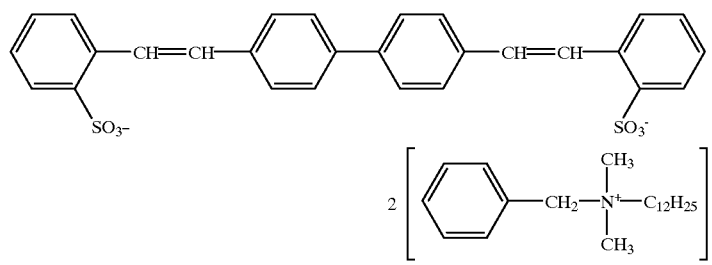
F-10
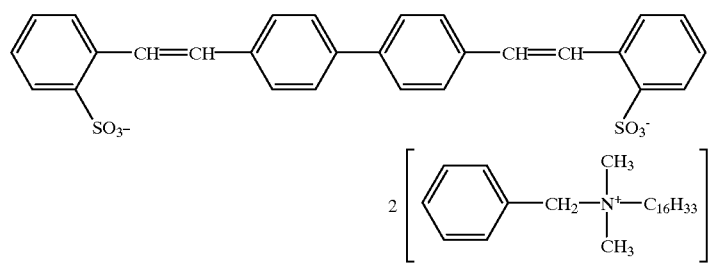
F-11
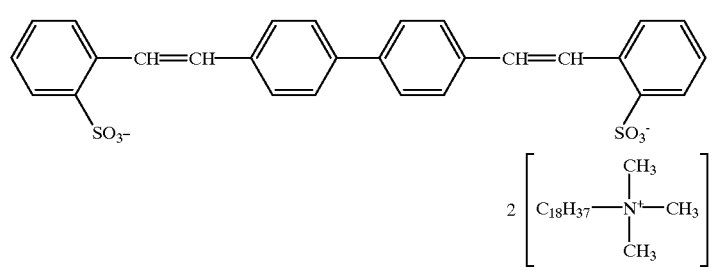
F-12

F-13
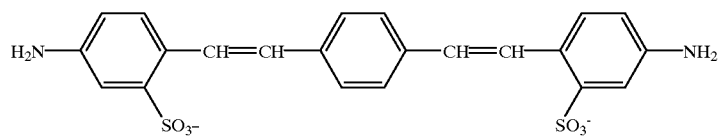
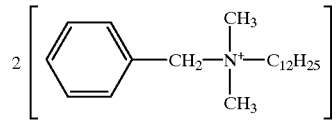
F-14
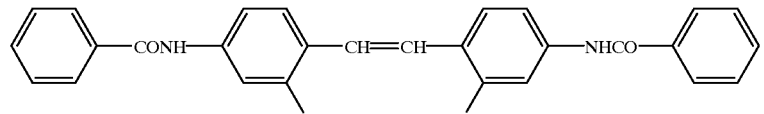
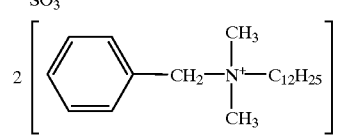
F-15
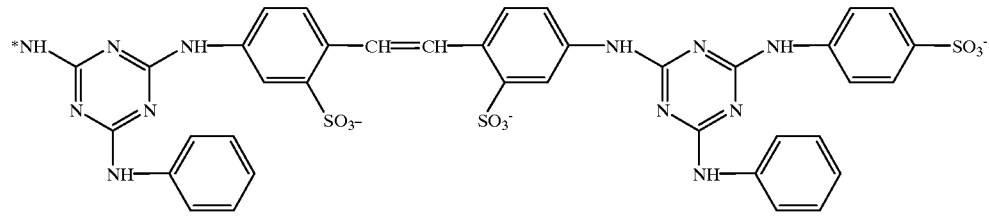
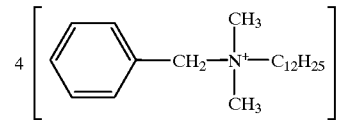
F-16
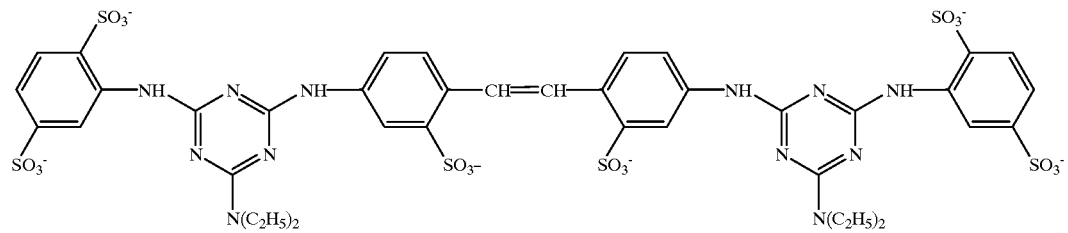
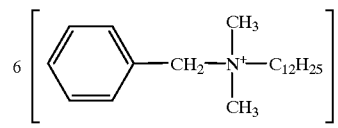
F-17
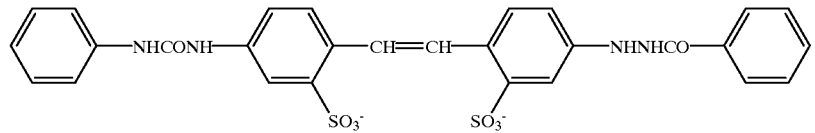
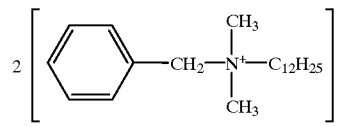

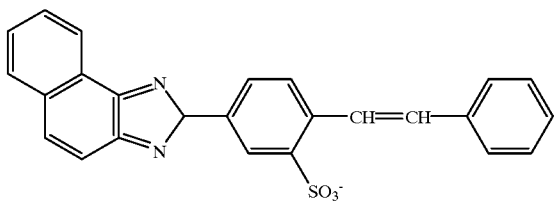

F-18

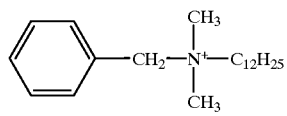

F-19

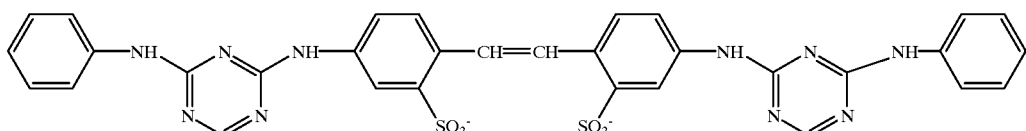

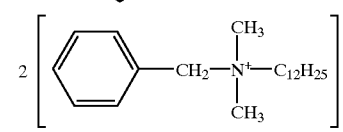

F-20

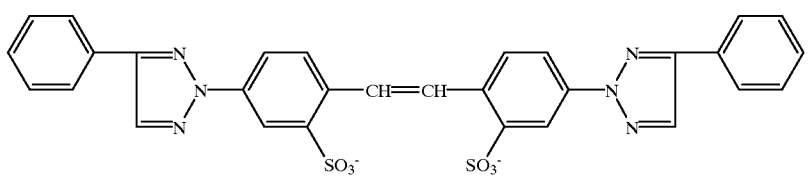

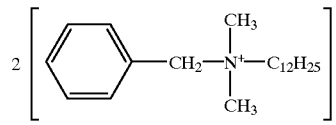

F-21

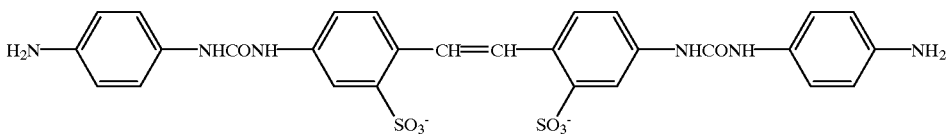

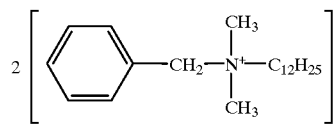

The brightening compound can be incorporated, in the form of fine solid particles, into the silver halide color photographic material. The fine solid particles is added in the form of a solid particle dispersing solution. The fine solid particles of the brightening compound can be dispersed by a method of pulverizing the compound and dispersing in water or a hydrophilic colloid aqueous solution such as a gelatin solution by the use of high-speed stirring type dispersing machine; a method of dispersing in water or a hydrophilic colloid aqueous solution such as a gelatin solution by the use of a dispersing machine having a high shearing stress, such as Manton-Gaulin homogenizer; and a dispersing method using a ultrasonic homogenizer. An anionic surfactant, nonionic surfactant or betaine type surfactant can be preferably used in dispersing. The fine solid particle dispersion has an average particle size of 0.05 to 5 $\mu$m, and preferably 0.1 to 2 $\mu$m. The brightening compound is incorporated preferably into a light-insensitive hydrophilic colloid layer, and more preferably into a light-insensitive hydrophilic colloid layer provided between a support and a silver halide emulsion layer nearest to the support. The brightening compound is incorporated preferably in an amount of 0.01 to 2 g/m$^2$, and more preferably 0.05 to 1 g/m$^2$.

In the process of subjecting the silver halide color photographic material to exposure, based on halftone dot information comprised of color-separated yellow image information, magenta image information, cyan image information and black image information, to prepare a color proof, the halftone dot image information, at least a part of which is converted to halftone dot images having 200×10$^3$ or more dots (preferably, 300×10$^3$ or more dots, more preferably 400×10$^3$ or more dots, and still more preferably 400×10$^3$ to 2000×10$^3$ or more dots) per inch$^2$ at a 40-dot percentage, is employed. The dot number can be measured by counting the photographed dot image by using a common microscope.

The halftone dot image used in the invention is specifically effective in the case of a halftone dot image used for high definition printing by a conventional AM screening method. In addition, the present invention is further more effective in the case of a dot image formed by a screening method referred to as a so-called FM screen method in which the frequency is modulated. Namely, if a color proof is prepared from the halftone dot image information which is prepared by means of frequency modulation and by means of a method other than the present invention, the average distance between dots is maintained to be a distance larger than a certain distance when the percentage of the original is small. However, with an increase of the dot percentage, the average distance between dots is progressively reduced in the case of the frequency modulation compared to AM modulation. Accordingly, fluctuation of the neutrality of the dot percentage of the proof prepared based on the dot percentage of the original is easily produced, due to minute slippage of resister marks, which is a standard for processing and registration.

In the present invention, it is preferred that the halftone dot image information is a halftone image recorded on a film and that exposure is carried out by bringing the film into close contact with the photographic material and then by scanning the photographic material. To achieve close contact, a vacuum contacting method is preferably employed. Further, it is preferred to carry out exposure to light from the light source through an optical means to improve parallelism. Means for improving the parallelism of light emitted from the light source include an optical lens, a reflecting mirror or a honeycomb structure in which light other than parallel light is absorbed by walls due to the light passing through a linear tube-type optical path. In addition, parallelism can be enhanced by means of aggregated optical fibers. Furthermore, it is also preferred to carry out exposure by means of laser scanning, based on the halftone dot image information described above.

Next, a reflective support used in the present invention will be explained. It is preferable that the reflective support used in the present invention has a base paper, as base, laminated on both sides thereof with a polyolefin resin. The raw material of the base paper used for the present invention can be selected from those ordinarily used for photographic paper. For example, natural pulp, synthetic pulp, mixtures of natural pulp and synthetic pulp and various raw materials for papering are cited. Ordinarily, conifer pulp, hard-wood pulp and natural pulp wherein a mixed pulp of a conifer pulp and a hard-wood pulp are the main components are widely be used. In addition, in the above-described support, additives ordinarily used in papers such as sizing agents, fixing agents, heavy duty strengthening agents, fillers, anti-static agents and dyes may be added. In addition, surface sizing agents, surface tension agents and anti-static agents may be coated appropriately on the surfaces.

For the support described above, those having a flat surface and ordinarily a weight of 50 through 300 g/m$^2$, are preferably used. A resin, laminated on both surfaces may be selected from a single polymer such as ethylene, polyethylene terephthalate and α-olefines such as polypropylene, a copolymer of at least two kinds of the above-mentioned olefines and mixtures of at least two kinds of polymers. Specifically preferable polyolefin resins are a low density polyethylene, high density polyethylene or an admixture of them.

The molecular weight of the polyolefin resin is not specifically limited. However, normally, those within a range of 20,000 through 200,000 are preferable.

A polyolefin resin-laminated layer on one side of a photographic support used in the present invention, where a photographic emulsion is coated, is preferably 5 through 50 μm and more preferably 7 through 35 μm.

With regard to polyolefin used for laminating the rear side (the side opposite to the surface wherein emulsion layers are provided) of the support, ordinarily, a mixture of a low density polyethylene and a high density polyethylene is fused and then laminated. This layer is generally subjected to a matting treatment.

In a polyolefine resin used for laminating the surface (on which emulsion layers are provided) of the support used in the present invention, preferably 13 through 20 weight % and more preferably 15 through 20 weight % of white pigment is dispersed and mixed.

As a white pigment, an inorganic and/or an organic white pigment can be used, including sulfate of alkaline earth metals such as barium sulfate, carbonate of alkaline earth metals such as calcium carbonate, silica such as fine powdery silicic acid and synthetic silicate, calcium silicate, alumina, alumina hydrate, titanium oxide, zinc oxide, talc and clay.

Of these, preferable are barium sulfate, calcium carbonate and titanium oxide. More preferable are barium sulfate and titanium oxide.

The titanium oxide may either be a rutile type or an anatase type. In addition, those laminated with a metal oxide such as alumina oxide hydrate and ferrite oxide hydrate may also be used.

In addition, it is preferable to use an anti-oxidation agent, a colored pigment for improving whiteness and a fluorescent brightening agent. When laminating the surface and a back side of the support, in order to enhance flatness of an exposed photographic paper in a normal environment, a means to increase the density of the resin layer on the surface slightly more than the back side and a means to increase the amount of lamination of the back side to be greater than the surface, are ordinarily adopted.

In addition, for ordinary lamination of the surface and back of the support, a polyolefin resin component is formed on the support by means of a fusion extruding coating method. It addition, it is preferable that the surface of the support and, if necessary, both sides of the support are subjected to corona discharge processing as well as flame processing. In addition, it is also preferable to provide a sub-coating layer for improving adhesion property with the photographic emulsion on the surface of the surface lamination layer or to provide a backing layer for improving printing and writing property and anti-static property on the lamination layer on the back side.

It is preferable that sharpness is improved by coating a hydrophilic colloidal layer containing a white pigment on the support. As a white pigment, the same white pigment as the foregoing can be used. Titanium oxide is preferable. In a hydrophilic colloidal layer containing a white pigment, it is preferable to add a hollow fine particle polymer and a high boiling organic solvent since sharpness and/or curling resistance can be improved.

In a preferable embodiment of the present invention, it is preferable to form a protective layer on the outermost surface of the photographic material and to add fine particle powder into the protective layer. As the fine particle powder (matting agent) and using method thereof, it is preferable to use a technology described in Japanese Patent O.P.I. Publication No. 95283/1994, page 4 left column, line 42nd through page 4, right column, line 33. In addition, as a reflective support used in the present invention, synthetic resin film supports such as polypropylene laminated with polyolefin on the surface can also be used.

There is no limit to the thickness of the reflective support used in the present invention, 80 through 160 μm being preferable, and 90 through 130 μm being more preferable.

The surface of the reflective support used in the present invention may be flat or may have some appropriate surface coarseness. However, it is preferable to select a reflective support having glossiness close to a printed material. For example, it is preferable to use a white support whose average surface roughness stipulated in JIS B 0601-1976 is 0.30 through 3.0 μm.

In the present invention, surface roughness on an image forming surface is preferably 0.30 through 3.0 μm. For this purpose, a matting agent may be added in a structural layer on the image forming surface side. The matting agent may be added in the silver halide emulsion layer, the protective layer, the intermediate layer and the subbing layer. It may be added to plural layers, and preferably, to the outermost light-sensitive layer.

It is preferable that the surface on the image forming layer side of the photographic material of the present invention has glossiness close to a printed material. For example, the degree of glossiness GS (60°) measured by a method stipulated in JIS-Z8741 is preferably 5 through 15, and more preferably 5 through 20.

As the silver halide emulsion used in the present invention there may be used a surface latent image-type silver halide emulsion that is imagewise exposed to form a latent image on a surface, and further processed to thereby form a negative image. There may also be suitably used an internal latent image-type silver halide emulsion having its grain surface previously unfogged which, after being imagewise exposed, is subjected to fogging treatment (nucleus-formation treatment) followed by surface development or which, after being imagewise exposed, is subjected to surface development while being subjected to fogging treatment to thereby obtain a direct positive image.

The above fogging treatment may be achieved by overall exposure of the emulsion to light, chemically fogged with a fogging agent, processed in a strong developing solution or subjected to heat treatment. The aforementioned internal latent image-type silver halide grain-containing emulsion is an emulsion containing silver halide crystal grains each having a sensitivity speck mainly in the interior to form an internal latent image when exposed to light.

The previously unfogged internal latent image-type silver halide emulsion usable in the present invention is an emulsion containing silver halide grains each forming a latent image mainly within the grain and having most of sensitivity specks in the interior, and comprised of silver bromide, silver chloride, silver chlorobromide, silver chloroiodide, silver iodobromide, or silver chloroiodobromide.

The above emulsion is most preferably one which when coated on a support to prepare a sample so that its silver coating weight is in the range of about 1 to 3.5 g/m$^2$, and when a portion of the prepared sample is subjected to light intensity scale exposure for specified periods of time ranging from 0.1 to 1.0 second and developed at 20° C. for 4 minutes in the following surface developing solution A, which contains substantially no silver halide solvent for developing the surface image of the grain, the maximum density of the thus processed piece is not more than ⅕ of the maximum density of the other part of the same sample that was obtained by being similarly exposed and developed at 20° C. for 4 minutes in the following internal developing solution B capable of developing the internal latent image.

| (Surface developing solution A) | |
|---|---|
| Metol | 2.5 g |
| L-ascorbic acid | 10.0 g |
| Sodium metaborate, tetrahydrate | 35.0 g |
| Potassium bromide | 1.0 g |
| Water to make | 1000 cc |
| (Internal developing solution B) | |
| Metol | 2.0 g |
| Anhydrous sodium sulfite | 90.0 g |
| Hydroquinone | 8.0 g |
| Sodium carbonate, monohydrate | 52.5 g |
| Potassium bromide | 5.0 g |
| Potassium iodide | 0.5 g |
| Water to make | 1000 cc |

The internal latent image-type silver halide emulsions suitably usable in the present invention include those prepared in various methods, such as the conversion-type silver halide emulsion described in U.S. Pat. No. 2,592,250; the silver halide emulsion comprising internal chemically sensitized silver halide grains described in U.S. Pat. Nos. 3,206,316, 3,317,322 and 3,367,778; the emulsion containing polyvalent metallic ion-occluded silver halide grains described in U.S. Pat. Nos. 3,271,157, 3,447,927; the silver halide emulsion comprising weakly chemically sensitized silver halide grains containing a dopant described in U.S. Pat. No. 3,761,276; the silver halide emulsion comprising grains having a multilayer structure described in JP-A Nos. 50-8524, 50-38525 and 53-2408; and the silver halide emulsion described in JP-A Nos. 52-156614 and 55-127549.

The internal latent image-type silver halide grain usable in the present invention may be any of silver halides such as silver bromide, silver chloride, silver chlorobromide, silver chloroiodide, silver iodobromide or silver chloroiodobromide. Silver chloride containing grains are superior in the developability and are suitable for rapid processing.

The silver halide crystal grains used in the present invention may have any of several common forms such as a cubic form, an octahedral form, a tetradecahedral form comprised of (100) and (111) faces, a form having (110) faces, a spherical form or a tabular form. Preferred silver halide grains are those having an average grain diameter of 0.05 to 3 μm. The silver halide emulsion used in the present invention may be either a monodisperse emulsion comprised of grains which are homogeneous in the grain diameter and crystal habit, or a polydisperse emulsion comprised of grains which are inhomogeneous in the grain diameter and crystal habit. In the present invention, the monodisperse silver halide emulsion is one in which silver halide grains having a grain diameter within the range of the average diameter rm±20% accounts for preferably not less than 60%, more preferably not less than 70%, and still more preferably not less than 80% of the weight of the total silver halide grains. The average grain diameter (rm) herein is defined as the grain diameter ri in the instance where the product of frequency ni of the grain having a grain diameter ri and ri$^3$, i.e., nixri$^3$, comes to the maximum (rounded to three decimal places). Herein, the grain diameter, in the case of a spherical silver halide grain, is the diameter itself, while in the case of a non-spherical grain, is the diameter of an equivalent circule to the grain projected area. The grain diameter can be obtained by a method in which the grain is electron microphotographically enlarged 10,000 to 50,000times, and the diameter of the enlarged grain image on its photo print or the area of the projection grain image enlarged likewise is actually measured. (The number of grains for measurement shall be 1000 or more at random.)

The most preferred highly monodispersed emulsion is comprised of silver halide grains having a grain diameter distribution width of not more than 20%, the distribution width being defined by grain diameter standard deviation/average diameter×100=distribution width (%)

wherein the above average grain diameter and the grain diameter standard deviation are to be found from the earlier defined ri.

The monodisperse emulsion can be obtained by adding an aqueous silver salt solution and an aqueous halide solution under controlled pAg and pH conditions according to a double-jet precipitation method. For determination of the addition rate, reference can be made to JP-A Nos. 54-48521 and 58-49938. To obtain a high monodisperse emulsion, there can be used the method for growing the grain in the presence of a tetrazaindene compound, which was disclosed in JP-A No. 60-122935.

In addition, it is also preferable to add two or more kinds of mono-dispersed emulsions in one sensitive layer.

The grain size in each emulsion layer of the photographic material of the present invention can be determined from a wide range, considering various properties including performance thereof, specifically, its sensitivity, sensitivity balance, color separation sharpness and graininess.

In the photographic material of the present invention, it is preferable to contain a nitrogen-containing heterocyclic compound having a mercapto group. The preferable compounds are those represented by Formula [XI] described in JP-A No. 6-95283, page 19, right column, line 20th through 49th. The more preferable compounds are those represented by Formula [XII], Formula [XIII] and [XIV] described in the above-mentioned specification, page 20, left column, line 5th through page 20, right column, line 2nd. Exemplary examples of the compounds include Compounds (1) through (39) described in JP-A No. 64-73338, page 11 through page 15.

The addition amount of the above-mentioned mercapto compound may optionally be varied depending of the kind of compounds used and the added layer. Ordinarily, when added to the silver halide emulsion layer, it is preferable to be $10^{-8}$ through $10^{-2}$ mol and more preferable to be $10^{-6}$ through $10^{-3}$ mol.

In one preferable embodiment of the present invention, the grain size of silver halide is preferably 0.1 through 0.6 μm for the red-sensitive layer emulsion, 0.15 μm through 0.8 μm for the green-sensitive layer emulsion and 0.3 through 1.2 μm for the blue-sensitive layer emulsion.

Preferred magenta couplers used in the present invention are compounds represented by [M-1] described in JP-A No. 95283/1994, page 7, right column in terms of superior spectral absorption properties of coloring dyes. Practical example of preferable compounds include compounds M-1 through M-19 described in the above-mentioned specification, page 8 through page 11. In addition, as other examples, compounds M-1 through M-61 described in European Patent No. 0,273,712, pp. 6 through 21 and compounds 1 through 223 described in European Patent No. 0,235,913, pp. 36 through 92, except those described above. The above-mentioned couplers may be used in combination with other kinds of magenta couplers. Ordinarily, they can be used preferably in a range of $1\times10^{-3}$ through 1 mol and more preferably in a range of $1\times10^{-2}$ through $8\times10^{-1}$ mol per mol of silver halide.

In the photographic material of the present invention, spectral absorption $\lambda_{L0.2}$ of the magenta image is preferably 580 through 635 nm.

In the photographic materials whose $\lambda_{L0.2}$ is 580 through 635 nm, λmax of the spectral absorption of the magenta image is preferably 530 through 560 nm.

Here, $\lambda_{L0.2}$ and λmax of the spectral absorption of the magenta image of the photographic material of the present invention are measured by the following methods.

(Measurement method of $\lambda_{L0.2}$ and λmax)

In the case of a positive type, the photographic material of the present invention is uniformly exposed to red light in a minimum amount capable of obtaining the minimum density of the cyan image and is also uniformly exposed to blue light a minimum amount capable of obtaining the minimum density of the yellow image. Following this, a white light is irradiated through an ND filter, and then, when the photographic material is subjected to photographic processing, an integrating sphere is mounted to a spectrophotometer and the value is corrected to zero by means of a standard white plate made of magnesium oxide. A magenta image is prepared by adjusting the density of the ND filter in such a manner that the maximum value of absorbance when spectral absorption of 500 through 700 nm is measured.

In the case of the negative type, a photographic material is exposed to a green light through the ND filter. When the photographic material is subjected to photographic processing to form a magenta image, the density of the ND filter is adjusted to the same maximum absorbance as the above-mentioned positive type. $\lambda_{L0.2}$ s defined as a wave longer than a wavelength wherein the maximum absorbance shows 1.0 in the spectral absorbance curve and its absorbance shows 0.2.

In order to adjust spectral absorption property of the magenta dye image (or a cyan and a yellow image) as described above, it is preferable to add a compound having a color tone adjusting effect. Preferred examples of such compounds include compounds represented by [HBS-I] and [HBS-II] described in JP-A No. 6-95283, page 22 are preferable, and compounds represented by Formula [HBS-II] described in the above-mentioned specification, page 22.

It is preferable that a yellow coupler be contained, in addition to a magenta coupler, in the magenta image forming layer of the photographic material of the present invention. The difference of pKa of the above-mentioned couplers is preferably within 2 and more preferably within 1.5. The preferable yellow coupler contained in the magenta image forming layer of the present invention is a coupler represented by Formula [Y-Ia] described in JP-A 6-95283, page 12, right column. Of the couplers represented by the above-mentioned specification, the more preferable ones are those having a pKa value which is not lower than that of a coupler represented by a combined coupler [M-1] by 3, when it is combined with a magenta coupler represented by [M-1].

Practical examples of preferable compounds include, in addition to compounds Y-1 and Y-2 described in JP-A No. 6-95283, compounds (Y-1) through (Y-58) described in JP-A No. 139542/1990, pp. 13 through 17, but the compounds are not limited these compounds.

As a cyan coupler contained in the cyan image forming layer according to the present invention, conventional types such as phenol, naphthol or imidazole couplers can be used. Typically, phenol type couplers which are each substituted by an alkyl group, an acylamino group or a ureido group, naphthol type couplers formed from a 5-aminonaphthol nucleus and a two-equivalent type couplers having an oxygen atom-introduced leaving group. Of these, preferable compounds include those represented by Formula [C-I] and [C-II] described in JP-A No. 95283/1994, page 13. As a yellow dye forming coupler, a conventional acylacetoanilide type coupler can preferably be used. Of these, a benzoylacetoanilide type and a pivaloylacetoanilide type are advantageously employed. In the present invention, $\lambda_{L0.2}$ of the yellow image is preferably 515 nm or less. The $\lambda_{L0.2}$ of the present invention is defined by JP-A No. 6-95283, page 21, right column line 1 through 24. It refers to the size of unnecessary absorption at longer wavelength side in the spectral absorption property of the yellow dye image. In the present invention, the spectral absorption of the yellow image is preferably $\lambda_{L0.8}$ of not less than 450 nm, and more preferably $\lambda_{L0.8}$ of not less than 455 nm. In addition, $\lambda_{L0.2}$ is preferably 510 or less. $\lambda$max is preferably 430 or more.

In the present invention, an integrating sphere is mounted on a spectrophotometer HITACHI 320 to measure spectral absorbance.

When the photographic material of the present invention employs a coupler to form a yellow image, any of several couplers can be employed provided that they satisfy the above-mentioned conditions. Examples of preferable couplers include those represented by Formula [Y-1] described in JP-A No. 6-95283, page 21. Practical examples of the above-mentioned couplers are preferably compounds described in JP-A No. 3-241345, pp. 5 through 9 and compounds represented by Y-I-1 through Y-I-55. In addition, compounds described in JP-A No. 3-209466, pp. 11 through 14 and compounds represented by Y-1 through Y-30 are also preferably used.

The above-mentioned yellow couplers are preferably $1 \times 10^{-3}$ through 1 mol, and more preferably $1 \times 10^{-2}$ through $8 \times 10^{-1}$ mol per mol of silver halide in the silver halide emulsion layer.

The couplers used in the present invention are respectively preferably $1 \times 10^{-3}$ through 1 mol, and more preferably $1 \times 10^{-2}$ through $8 \times 10^{-1}$ mol per mol of silver halide in the silver halide emulsion layer. When an oil-in-water type-emulsifying dispersion method is employed for adding couplers and other organic compounds used for the photographic material of the present invention, in a water-insoluble high boiling organic solvent, whose boiling point is 150° C. or more, a low boiling and/or a water-soluble organic solvent are combined if necessary and dissolved. In a hydrophilic binder such as an aqueous gelatin solution, the above-mentioned solutions are emulsified and dispersed by the use of a surfactant. As a dispersing means, a stirrer, a homogenizer, a colloidal mill, a flow jet mixer and a supersonic dispersing machine may be used.

After dispersion, or concurrently with dispersion, a step to remove a low boiling organic solvent may be introduced. Preferred examples of the high boiling organic solvent capable of being used for dissolving a coupler for dispersion include phthalic acid esters such as dioctylphthalate, diisodecylphthalate and dibutylphthalate, phosphoric acid ester such as tricresyl phosphate and trioctylphosphate and phosphine oxides such as trioctyl phosphine oxide. The dielectric constant of the high boiling organic solvent is preferably 3.5 to 7. In addition, two or more kinds of the high boiling organic solvent may be used in combination.

As a high boiling organic solvent, the specifically preferable compounds are those represented by [HBS-I] and [HBS-II] described in JP-A No. 6-95283, page 22, and more specifically preferable compounds are those represented by [HBS-II]. Practical compounds are compounds I-1 through II-95 described in JP-A No. 2-124568, page 53 through 68.

As a surfactant used for adjusting surface tension when dispersing or coating photographic additives, the preferable compounds are those containing a hydrophobic group having 8 through 30 carbon atoms and a sulfonic acid group or its salts in a molecule. Exemplary examples thereof include A-1 through A-11 described in JP-A No. 64-26854. In addition, surfactants, in which a fluorine atom is substituted to an alkyl group, are also preferably used. The dispersion is conventionally added to a coating solution containing a silver halide emulsion. The elapsed time from dispersion until addition to the coating solution and the time from addition to the coating solution until coating are preferably short. They are respectively preferably within 10 hours, more preferably within 3 hours and still more preferably within 20 minutes.

To each of the above-mentioned couplers, to prevent color fading of the formed dye image due to light, heat and humidity, an anti-fading agent may be added singly or in combination. The preferable compounds or a magenta dye are phenyl ether type compounds represented by Formulas I and II in JP-A No. 2-66541, phenol type compounds represented by Formula IIIB described in JP-A No. 3-174150, amine type compounds represented by Formula A described in JP-A No. 64-90445 and metallic complexes represented by Formulas XII, XIII, XIV and XV described in JP-A No. 62-182741. The preferable compounds to form a yellow dye and a cyan dye are compounds represented by Formula I' described in JP-A No. 1-196049 and compounds represented by Formula II described in JP-A No. 5-11417.

It is preferable that a compound reacting with the oxidation product of a color developing agent be incorporated into a layer located between light-sensitive layers for preventing color staining and that the compound is added to the silver halide emulsion layer to decrease fogging. As a compound for such purposes, hydroquinone derivatives are preferable, and dialkylhydroquinone such as 2,5-di-t-octyl hydroquinone are more preferable. The specifically preferred compound is a compound represented by Formula II described in JP-A No. 4-133056, and compounds II-1 through II-14 described in the above-mentioned specification pp. 13 through 14 and compound 1 described on page 17.

In the photographic material according to the present invention, it is preferable that static fogging is prevented and light-durability of the dye image is improved by adding a UV absorber. The preferable UV absorber is benzotriazoles. The specifically preferable compounds are those represented by Formula III-3 in JP-A No. 1-250944, those represented by Formula III described in JP-A No. 64-66646, UV-IL through UV-27L described in JP-A No. 63-187240, those represented by Formula I described in JP-A No. 4-1633 and those represented by Formulas (I) and (II) described in JP-A No. 5-165144.

It is also to incorporate an oil-soluble dye or a pigment to improve white background. Preferred examples of the oil-soluble dye are compounds 1 through 27 described in JP-A No 2-842, page 8 to 9. In the photographic material of the present invention, gelatin is preferably used as a binder. Specifically, gelatin, extraction solution of which is subjected to hydrogen peroxide treatment to remove colored components of gelatin; ossein gelatins which are extracted from hydrogen peroxide-treated raw material ossein or manufactured from uncolored raw bone, are preferably used to enhance transmittance.

Gelatin used for the present invention may be any of an alkaline-processed ossein gelatin, an acid-processed gelatin, gelatin derivatives and modified gelatins. Specifically, the alkaline-processed ossein gelatin is preferable. The transmittance of the gelatin used in the photographic material relating to the present invention is preferably 70% or more, when a 10% solution is prepared and its transmittance at 420 nm is measured by the use of a spectrophotometer.

The jelly strength of the gelatin used in the present invention (measured by means of a PAGI method) is preferably 250 or more, and more preferably 270 g or more.

The total weight of gelatin contained on the image forming side of the photographic material according to the present invention is preferably less than 11 g/m$^2$. With regard to a lower limit, there is no specific limit. However, 3.0 g/m$^2$ or more is preferable in terms of photographic performance. The amount of gelatin is calculated in conversion to the weight of gelatin having moisture content of 11.0% when measured through a moisture measurement method described in the PAGI method.

As a hardener for the binders, a vinylsulfone type hardener and a chlorotriazine type hardener are preferably used independently or two or more of them are used in combination. Compounds described in JP-A Nos. 61-249054 and 61-245153 are preferably employed. It is also preferable to add antiseptics and anti-mildew agents described in JP-A No. 3-157646 in a colloidal layer to prevent propagation of mildew and bacteria which adversely affect photographic performance and image storage stability.

The yellow image forming layer, the magenta image forming layer and the cyan image forming layer relating to the present invention are coated on a support with an arbitrary order of coating from the support. One preferable embodiment is that, from the support, are the cyan image forming layer, the magenta image forming layer and the yellow image forming layer. In addition, if necessary, a black image forming layer, an intermediate layer, a filter layer and a protective layer may also be provided.

In the photographic material of the present invention, the reflection density of a unprocessed sample at the wavelength of the spectral sensitivity maximum of the cyan image forming silver halide emulsion layer is preferably 0.7 or more.

The photographic material of the present invention is obtained by incorporating a colorant material such as a dye having absorption at the above-mentioned wavelengths and black colloidal silver in any of photographic structural layers of the present invention. In the photographic material of the present invention, a water-soluble dye may be added to an arbitrary silver halide emulsion layer and/or other hydrophilic colloid photographic structural layer. In addition, in the photographic material of the present invention, a dye having at least one of a carboxyl group, a sulfonamide group and a sulfamoyl group may be incorporated by solid-dispersion in an arbitrary silver halide emulsion layer and/or other hydrophilic colloid photographic structural layer.

Examples of the dye having at least one of a carboxyl group, a sulfonamide group and a sulfamoyl group include compounds represented by Formulas [I] through [IX] described in JP-A No. 6-95283, pp. 14 through 16.

Examples of the dyes represented by the above-mentioned Formula [I] through {VIII} include compounds I-1 through VIII-7 described in JP-A No. 4-18545 are cited, but is not limited to these.

There is also specifically no limit to a layer to which the above-mentioned dyes and colloidal silver are incorporated. However, it is preferable that they be incorporated to a non-sensitive hydrophilic colloidal layer between the support and an emulsion layer closest to the support.

The silver halide used the present invention may be spectrally sensitized by the use of conventional sensitizing dye(s). Combined use of sensitizing dyes used for super-sensitization of an internal latent image forming silver halide emulsion and a negative type silver halide emulsion is also useful for the silver halide emulsion of the present invention. With regard to sensitizing dyes, Research Disclosure (hereinafter, abbreviated as RD) 15162 and 17643 are referred.

To the photographic material according to the present invention, it is preferable to add compounds which adjust the gradation of the toe portion of a characteristic curve. The preferable compounds are those represented by Formula [AO-II] described in JP-A No. 6-95283, page 17. As an example of preferable compounds, compounds II-1 through II-8 described on page 18 of the above-mentioned specification are given.

The added amount of the above-mentioned [AO-II] is preferably 0.001 to 0.50 g/m$^2$, and more preferably 0.005 to 0.20 g/m$^2$. The compound may be used singly or in combination. In addition, a quinone derivative having a 5 or more carbon atoms may be added to the compound of [AO-II]. However, in any cases, the amount used is preferably in a range of 0.001 through 0.50 g/m$^2$ in total. Fogging treatment in the internal latent image type direct positive type image formation used in the present invention preferably may be conducted by providing overall exposure or by the use of a compound producing a fogging nucleus, i.e., a fogging agent.

The overall exposure process is conducted by exposing a photographic material uniformly and overall after immersing the imagewise exposed photographic material into a developing solution or other aqueous solutions, or wetting therewith. Here, as a light source used, any light source that has a light-sensitive wavelength range of the photographic photographic material may be used. In addition, a high intensity light such as a flash may be given for a short time, or a low intensity light may be used for a period of longer time. In addition, the time of the overall exposure can be varied widely depending of the kind of the photographic photographic material, photographic processing conditions and the kind of light source used so that superior positive images can be obtained. It is still more preferable that the overall exposure is gived in an amount within a given range, in combination with with the photographic material. Ordinarily, when exposure amount is excessively given, an increase of the minimum density and desensitization result, which tends to deteriorate image quality. As a technology of a fogging agent usable in the present invention, the technology described in JP-A No. 6-95283, page 18, right column, line 39 through page 19, left column, line 41 is preferable.

It is preferable to incorporate a fluorescent brightening agent into the photographic material of the present invention and/or a processing solution which processes the photographic material of the present invention in terms of improving white background.

The developing solution, the bleach-fixing solution and the stabilizing solution can process a photographic material continuously while respectively replenishing the developing solution, the bleaching solution, the bleach-fixing solution and the stabilizing solution. In the present invention, the replenishing rate of the developing solution is preferably 700 cc or less and more preferably 500 cc or less per 1 m$^2$ of the photographic material. In such cases, the present invention provides effective result. In the case of other processing solutions too, the replenishing amount of the developing solution is preferably 700 cc or less and more preferably 500 cc or less per 1 m² Of the photographic material. In such cases, the present invention can provide effective result. The preferred developing agent usable in the developing solution for developing the photographic material of the present invention include ordinary silver halide developing agents such as hydroquinone, hydroxybenzenes, aminophenols, 3-pyrazolones, ascorbic acid and its derivatives, reductones, phenylenediamines, and mixtures thereof.

Specifically, cited are hydroquinone, aminophenol, N-methylaminophenol, 1-phenyl-3-pyrazolidone, 1-phenyl-4,4-dimethyl-3-pyrazolidone, 1-phenyl-4-methyl-4-hydroxymethyl-3-pyrazolidone, ascorbic acid, N,N-diethylaminotoluidine, 4-amino-3-methyl-N-ethyl-N-(p-methanesulfonamidoethyl)-aniline, 4-amino-3-methyl-N-ethyl-N-(β-hydroxyethyl)aniline, 4-amino-N-ethyl-N-(β-hydroxyethyl)aniline and 4-amino-3-methyl-N-ethyl-N-(γ-hydroxypropyl)aniline.

It is also possible to incorporate any of these anti-fogging agents into the silver halide emulsion to have the anti-fogging agent reacted with the silver halide while immersed in a high pH aqueous solution.

The developing solution used in the present invention may further contain a specific fogging agent and the development restrainer. Alternatively, it is possible to arbitrarily incorporate such photographic additives used for a developing solution into the component layer(s) of the photographic photographic material.

For the silver halide photographic photographic material in the present invention there may be used any of known photographic additives.

The above-referred to known photographic additives include the following compounds described in Research Disclosure RD 17643 and RD 18716.

| Page Section | RD 17643 | | RD 1 Additives | |
|---|---|---|---|---|
| | Page | Section | | |
| Chemical sensitizer | 23 | III | 648 | upper right |
| Sensitizing dye | 23 | IV | 648 | upper right |
| Development accelerator | 29 | XXI | 648 | upper right |
| Antifoggant | 24 | VI | 649 | lower right |
| Stabilizer | 24 | VI | 649 | lower right |
| Antistaining agent | 25 | VII | 650 | left to right |
| Image stabilizer | 25 | VII | | |
| UV absorbent | 25–26 | VII | 649 650 | right to left |
| Filter dye | 25–26 | VII | 649 650 | right to left |
| Brightening agent | 24 | V | | |
| Hardener | 26 | X | 651 | right |
| Coating aid | 26–27 | XI | 650 | right |
| Surfactant | 26–27 | XI | 650 | right |
| Plasticizer | 27 | XII | 650 | right |
| Lubricating agent | 27 | XII | 650 | right |
| Antistatic agent | 27 | XII | 650 | right |
| Matting agent | 28 | XVI | 650 | right |
| Binder | 29 | IX | 651 | right |

Cited as a support usable in the light-sensitive invention of the present invention are those described in the above-mentioned RD 17643, page 28 and RD 18716, page 647. Suitable supports include polymer films and papers, which may be provided with additional processing to enhance adhesion and anti-static properties.

To form an image using the photographic material of the present invention, it is preferable to employ a light source unit scanning exposure type automatic processing machine.

As practical example of such equipment or system for forming a specifically preferable image, Konsensus L, Konsensus 570 and Konsensus II are cited.

It is preferable to apply the present invention to a photographic material wherein a developing agent is not incorporated in the photographic material. Specifically, it is preferable to apply the present invention to the photographic material having a reflective support to form an image for direct visual stimulation, cited, for example is the photographic material for color proofs.

EXAMPLES

The present invention will be further explained in detail based on examples but embodiments of the present invention are not limited to these examples.

Example 1

Preparation of Emulsion EM-P1

To an aqueous ossein gelatin solution at a controlled temperature of 40° C. were simultaneously added both an aqueous ammoniacal silver nitrate solution and an aqueous potassium bromide solution in a controlled double-jet precipitation process, whereby a cubic silver chlorobromide core grain emulsion having an average grain diameter of 0.30 μm was obtained. During addition, the pH and pAg were controlled so as to form cubic crystal grains.

To the obtained core grain emulsion further were simultaneously added an aqueous ammoniacal silver nitrate solution and an aqueous potassium bromide and sodium chloride solution (at a molar KBr:NaCl ratio of 50:50) in the controlled double-jet precipitation process to continue formation of a shell phase to cover over the core grain of the above emulsion until reached the average grain diameter of 0.42 μm. During addition, the pH and pAg were controlled so that cubic grains were obtained.

After subjecting to washing to remove water-soluble salts, gelatin was added thereto to obtain emulsion EM-P1. The distribution width of the grain diameter of the emulsion EM-1 was 8%.

Preparation of Emulsion EM-P2

To an aqueous ossein gelatin solution at a controlled temperature of 40° C. were simultaneously added both an aqueous ammoniacal silver nitrate solution and an aqueous potassium bromide and a sodium chloride solution (at a molar KBr:NaCl ratio of 95:5) in the controlled double-jet precipitation process, whereby a cubic silver chlorobromide grain emulsion having an average grain diameter of 0.18 μm was obtained. During addition, the pH and pAg were also controlled so that cubic silver halide grains can be obtained. To the core emulsion thus prepared were further simultaneously added an aqueous ammoniacal silver nitrate solution and an aqueous potassium bromide and a sodium chloride solution (at a molar KBr:NaCl ratio of 40:60) in the controlled double-jet precipitation process to form a shell phase until reached an average grain diameter of 0.25 μm. During addition, the pH and pAg were controlled so that cubic silver halide grains can be obtained. After the above prepared emulsion was subjected to washing to remove water-soluble salts, gelatin was added thereto to obtain emulsion EM-P2. The distribution width of the grain diameters of the emulsion EM-P2 was 8%.

Preparation of Blue-sensitive Silver Halide Emulsion

Emulsion EM-P1 was optimally spectral-sensitized by adding a sensitizing dye BS-1, followed by addition of compound T-1 in an amount of 100 mg per mol of silver to obtain a blue-sensitive emulsion EM-B1.

Preparation of Green-sensitive Silver Halide Emulsion

A green-sensitive emulsion EM-G1 was prepared in the same manner as in the blue-sensitive emulsion Em-B1, except that in place of BS-1, sensitizing dye GS-1 was added to emulsion EM-P2 to optimally perform spectral sensitization.

Preparation of Red-sensitive Silver Halide Emulsion

A red-sensitive emulsion EM-R1 was prepared in the same manner as in the blue-sensitive emulsion Em-B1, except that in place of BS-1, sensitizing dyes RS-1 and RS-2 were added to emulsion EM-P2 to optimally perform spectral sensitization.

Preparation of Infrared-sensitive Silver Halide Emulsion

An infrared-sensitive emulsion EM-IR was prepared in the same manner as in the blue-sensitive emulsion Em-B1, except that in place of BS-1, a sensitizing dye IRS-1 was added to emulsion EM-P1 to optimally perform spectral sensitization. It was proved that the emulsion EM-P2 had a spectral sensitivity maximum at the wavelength of 765 nm.

T-1: 4-hydroxy-6-methyl-1,3,3a,7-tetrazaindene

On a paper pulp reflective support of 110 pm thickness in which a high density was laminated on one side and polyethylene containing a dispersed anatase type titanium oxide in a given amount of 15 weight % on the other side, using each of emulsions EM-B1, EM-G1, EM-R1 and EM-IR, each layer having the following constitution was coated on a side having the polyethylene layer containing titanium oxide, and on the opposite side, 6.00 g/m$^2$ of gelatin and 0.65 g/m$^2$ of a silica matting agent were coated. Thus, multi-layered silver halide color photographic photographic material Samples 1-1 to 1-7 were prepared. In this case, as a hardener, H-1 and H-2 were added. As a coating aid and a dispersion aid, surfactants SU-1, SU-2 and SU-3 were added.

SU-1: Sodium di-2-ethylhexyl sulfosuccinate

SU-2: Sodium di(2,2,3,3,4,4,5,5-octafluoropentyl) sulfosuccinate

SU-3: Sodium tri-i-propylnaphthalenesulfonate

H-1: 2,4-Dichloro-6-hydroxy-s-triazine sodium salt

H-2: Tetrakis(vinylsulfonylmethyl)methane

| Layer | Constitution | Coating wt(g/m$^2$) |
|---|---|---|
| 12th Layer (UV absorbing layer) | Gelatin | 1.20 |
| | UV absorbent (UV-1) | 0.07 |
| | UV absorbent (UV-2) | 0.02 |
| | UV absorbent (UV-3) | 0.07 |
| | Silica matting agent | 0.01 |
| 11th Layer (Blue-sensitive layer) | Gelatin | 0.92 |
| | Blue-sensitive emulsion (EM-B1) | 0.33 |
| | Magenta coupler (M-1) | 0.20 |
| | Yellow coupler (Y-3) | 0.05 |
| | Restrainer (T-1) | 0.002 |
| | Restrainers (T-2, T-3, T-4) (mol ratio 1:1:1) | 0.0004 |
| | Anti-staining agent (HQ-1) | 0.03 |
| | High boiling solvent (SO-1) | 0.31 |
| 10th Layer (Intermediate layer) | Gelatin | 0.40 |
| | Anti-staining agent (HQ-2) | 0.02 |
| | Anti-staining agent(HQ-3) | 0.01 |
| | High boiling solvent (SO-2) | 0.005 |
| 9th Layer | Gelatin | 0.08 |

-continued

| Layer | Constitution | Coating wt(g/m$^2$) |
|---|---|---|
| (Yellow colloidal layer) | Yellow colloidal silver | 0.09 |
| | Antistaining agent (HQ-2) | 0.02 |
| | Antistaining agent (HQ-3) | 0.01 |
| | High boiling solvent (SO-2) | 0.005 |
| | Polyvinyl pyrrolidone | 0.04 |
| 8th Layer (Intermediate layer) | Gelatin | 0.04 |
| | Antistaining agent (HQ-2) | 0.02 |
| | Antistaining agent (HQ-3) | 0.01 |
| | High boiling solvent (SO-2) | 0.005 |
| 7th Layer (Green-sensitive layer) | Gelatin | 1.20 |
| | Green-sensitive emulsion (EM-G1) | 0.38 |
| | Yellow coupler (Y-1) | 0.51 |
| | Magenta coupler (M-1) | 0.11 |
| | High boiling solvent (SO-3) | 0.31 |
| | Antistaining agent (HQ-1) | 0.06 |
| | Restrainer (T-1) | 0.004 |
| | Restrainers (T-2, T-3, T-4) (mol ratio 1:1:1) | 0.0002 |
| 6th Layer (Intermediate layer) | Gelatin | 0.50 |
| | Antistaining agent (HQ-2) | 0.04 |
| | Antistaining agent (HQ-3) | 0.02 |
| | High boiling solvent (SO-2) | 0.01 |
| 5th Layer (Cyan layer) | Gelatin | 1.75 |
| | Red-sensitive emulsion (EM-R1) | 0.25 |
| | Green-sensitive emulsion (EM-G1) | 0.24 |
| | Cyan coupler (C-100) | 0.35 |
| | High boiling solvent (SO-4) | 0.33 |
| | High boiling solvent (SO-5) | 0.33 |
| | Antistaining agent (HQ-1) | 0.035 |
| | Restrainer (T-1) | 0.0015 |
| | Restrainers (T-2, T-3, T-4) (mol ratio 1:1:1) | 0.0004 |
| 4th Layer (Intermediate layer) | Gelatin | 0.70 |
| | Antistaining agent (HQ-2) | 0.04 |
| | Antistaining agent (HQ-3) | 0.02 |
| | High boiling solvent (SO-2) | 0.01 |
| | Antiirradiation dye (AI-1) | 0.03 |
| | Antiirradiation dye (AI-2) | 0.03 |
| 3rd Layer (Red sensitive layer) | Gelatin | 1.10 |
| | Red-sensitive emulsion (EM-IR1) | 0.40 |
| | Yellow coupler (Y-1) | 0.43 |
| | Yellow coupler (Y-2) | 0.10 |
| | High boiling solvent (SO-1) | 0.43 |
| | Antistaining agent (HQ-1) | 0.05 |
| | Restrainer (T-1) | 0.006 |
| | Restrainers (T-2, T-3, T-4) (mol ratio 1:1:1) | 0.0004 |
| 2nd Layer (Intermediate layer) | Gelatin | 0.40 |
| | Antistaining agent (HQ-2) | 0.01 |
| | Antistaining agent (HQ-3) | 0.005 |
| | High boiling solvent (SO-2) | 0.003 |
| | Antiirradiation dye (AI-4) | 0.05 |
| | Brightener solid fine particles (F-10) | 1.40 |
| 1st Layer (Antihalation layer) | Gelatin | 0.60 |
| | Latex (LA-1) | 0.12 |
| | Black colloidal silver | 0.03 |
| | Polyvinyl pyrrolidone | 0.10 |
| | Titanium oxide | Table 1 |
| Support | Polyethylene laminated paper (containing minute amount of colorant) | |

The silver coating weight in the above is in silver equivalents.

SO-1: Tri(n-octyl)phosphine oxide

SO-2: Di(i-decyl)phthalate

HQ-1: 2,5-Di(t-butyl)hydroquinone

HQ-2: 2,5-Di[(1,1-dimethyl-4-hexyloxycarbonyl)butyl]-hydroquinone

HQ-3: Mixture of 2,5-di-sec-dodecylhydroquinone, 2,5-di-sec-tetradecylhydroquinone and $^2$-sec-dodecyl-5-sec-tetradecylhydroquinone (wt. ratio 1:1:2)

T-2: 1-($^3$-Acetoamidophenyl)-5-mercaptotetrazole

T-3: N-Benzyladenine

T-4: $^2$-Mercaptobenzothiazole

BS-1
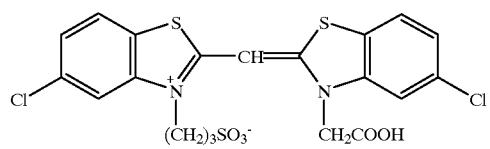
GS-1
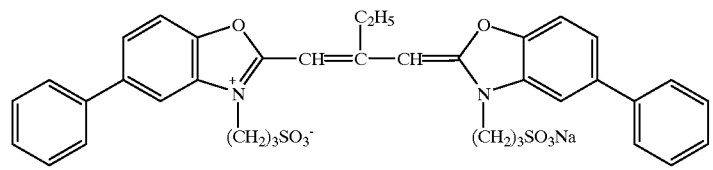
RS-1
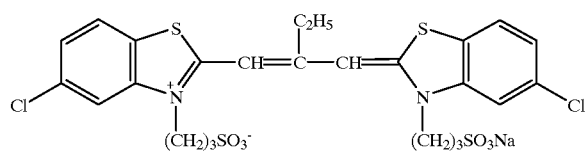
RS-2
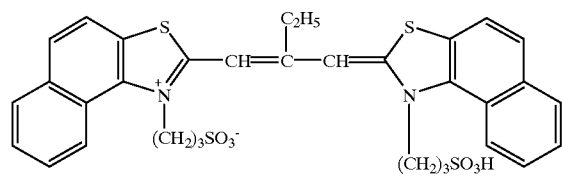
Y-1
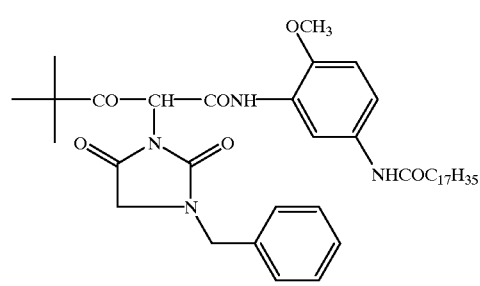
Y-2
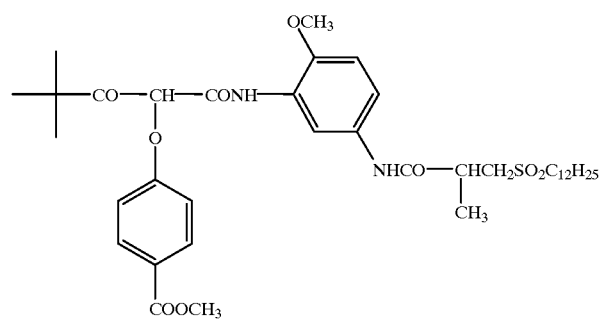
Y-3
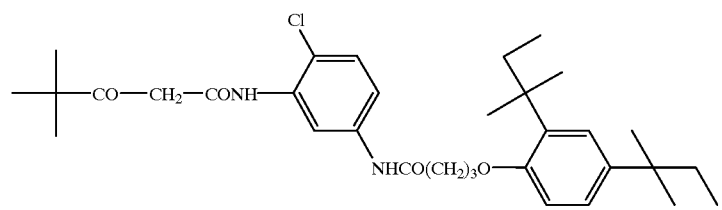

M-1
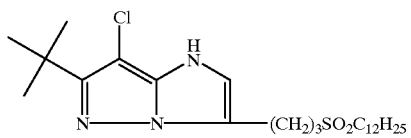
C-100
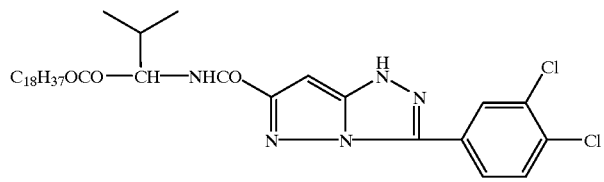
SO-1
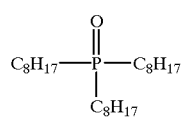
SO-3
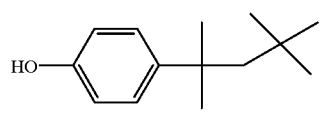
SO-4
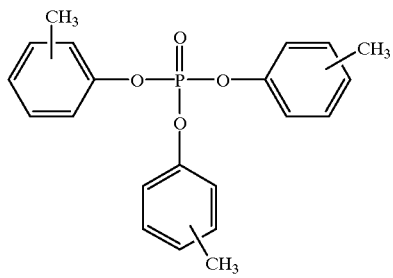
SO-5
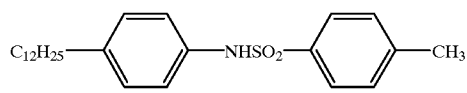
HQ-1
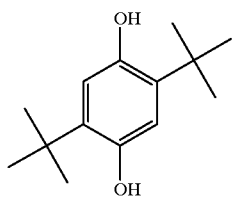
AI-4
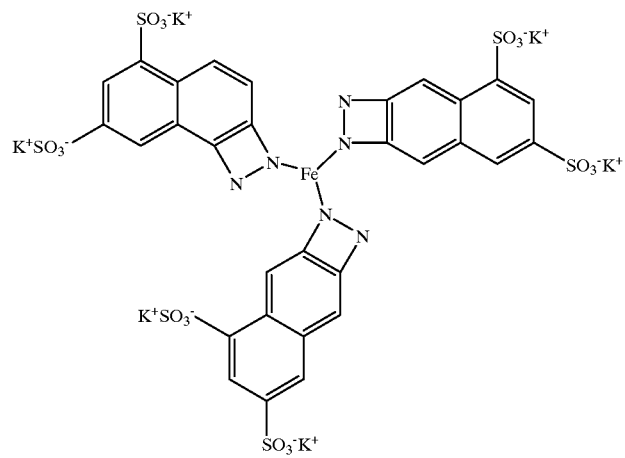

F-10
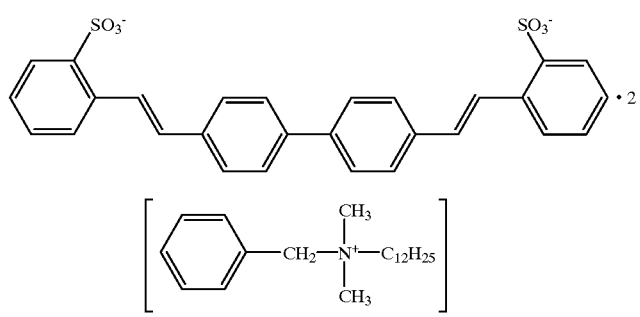
AF-1
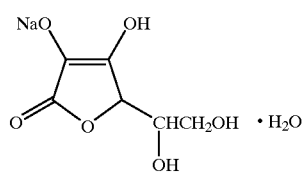
IRS-1
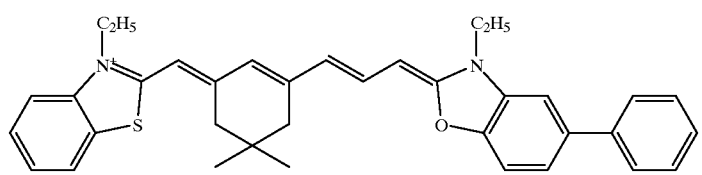
C-100
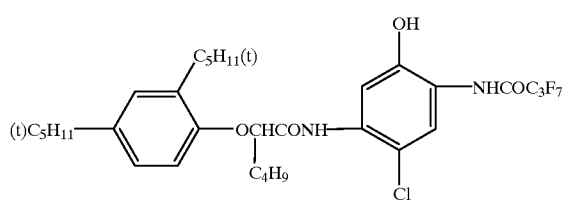
UV-1
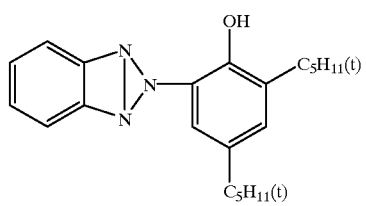
UV-2
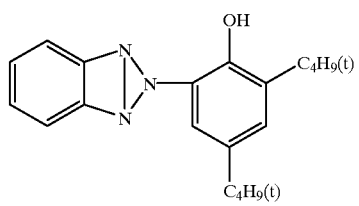
UV-3
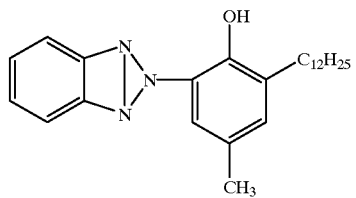

-continued

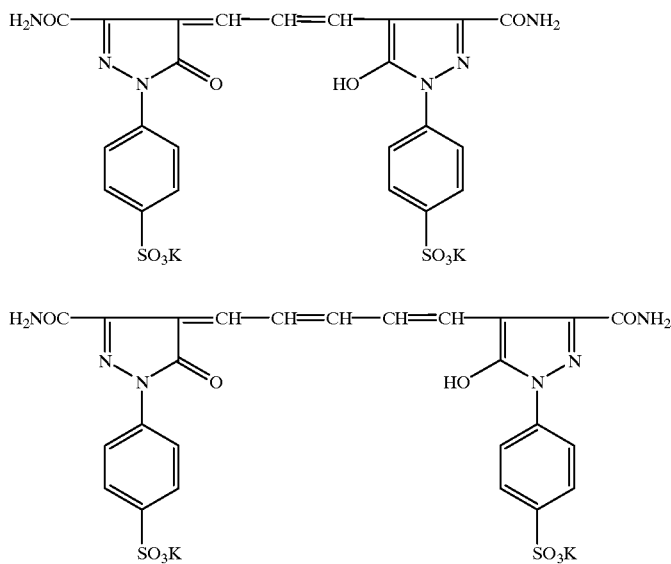

AI-1

AI-2

TABLE 1

| Sample No. | Titanium Oxide | Coverage (g/m²) |
|---|---|---|
| 1-1 | None | 0.0 |
| 1-2 | Anatase type titanium oxide with av. size of 0.15 μm | 1.0 |
| 1-3 | Rutile type titanium oxide with av. size of 0.20 μm | 1.0 |
| 1-4 | Anatase type titanium oxide with av. size of 0.29 μm | 1.0 |
| 1-5 | Rutile type titanium oxide with av. size of 0.29 μm | 1.0 |
| 1-6 | Rutile type titanium oxide with av. size of 0.35 μm | 1.0 |
| 1-7 | Rutile type titanium oxide with av. size of 0.75 μm | 1.0 |

The obtained Sample 1-1 to 1-7 each were exposed to light under the following exposure condition-Y through a yellow halftone original in close contact therewith, then exposed to light under the following exposure condition-M through a magenta halftone original in close contact therewith, then further exposed to light under the following exposure condition-C through a cyan halftone original in close contact therewith and then further exposed to light under the following exposure condition-Y through and a black halftone original in contact therewith. In the halftone originals employed above, images having a halftone percentage of 50% at 175 lines/inch (hereinafter, also referred to as a middle dot) were included in each of the yellow, magenta, cyan and black originals so that reproducibility of the image with 50% dots was evaluated with respect to the dot percentage. Further, each original included a portion in which the dot percentage was varied so as to evaluate reproducibility of small dots.

Thus-exposed samples were each processed according to the process as shown below to obtain dye images comprised of halftone dots.

Exposure condition-Y

Each photographic material sample was exposed, through infrared filters (LEF Filters 026 and 363 were employed one over the other) and an ND filter, to an infrared light source for 0.3 seconds. Exposure was adjusted by varying the ND filter density so that after processing, the yellow halftone dot original with the dot percentage of 50% gave dots with the dot percentage of 60% (Exposure condition-Y60) or dots with the dot percentage of 65% (Exposure condition-Y65).

Exposure condition-M

Each photographic material sample was exposed, through blue filters (Wratten filter No. 47B) and an ND filter, to a white light source for 0.3 seconds. Exposure was adjusted by varying the ND filter density so that after processing, the magenta halftone dot original with the dot percentage of 50% gave dots with the dot percentage of 60% (Exposure condition-M60) or dots with the dot percentage of 65% (Exposure condition-M65).

Exposure condition-C

Each photographic material sample was exposed, through red filters (Wratten filter No. 26) and an ND filter, to a white light source for 0.3 seconds. Exposure was adjusted by varying the ND filter density so that after processing, the cyan halftone dot original with the dot percentage of 50% gave dots with the dot percentage of 60% (Exposure condition-C60) or dots with the dot percentage of 65% (Exposure condition-C65).

Exposure condition-K

Each photographic material sample was exposed, through green filters (Wratten filter No. 58) and an ND filter, to a white light source for 0.3 seconds. Exposure was adjusted by varying the ND filter density so that after processing, the cyan halftone dot original with the dot percentage of 50% gave dots with the dot percentage of 60% (Exposure condition-K60) or dots with the dot percentage of 65% (Exposure condition-K65).

In the exposure condition-Y, an infrared fluorescent lamp emitting infrared radiation was employed as an infrared light source. The white light source employed in the exposure conditions-M, C and K was a daylight fluorescent lamp.

The samples were each processed according to the following Process-1 (fresh solution processing). The fog exposure was carried out as follows. The sample was immersed in a 3 mm thick developing solution and subjected to uniform overall exposure. In the Process-1, Sample 1-6 was running-processed until the replenishing amount of a developing solution replenisher reached three times the content of the developing solution tank, and thereafter, samples were each processed using the developing solution, bleach-fixing solution and stabilizing solution which were obtained after running processing.

The obtained images of each sample were evaluated with respect to yellow, magenta and cyan densities of the white background at the time the dot percentage of medium dots was 65% and yellow, magenta and cyan densities of the white background at the time the dot percentage of medium dots was 60%, and with respect to small dot reproducibility of yellow, magenta, cyan and black images. With respect to the densities of the white background, difference between the white background density at the dot percentage of 65% and that at the dot percentage of 60% was shown as white background variation in Table 2.

| Process-1 Processing step | Temperature | Time |
|---|---|---|
| Immersing in developing solution | 37° C. | 12 seconds |
| Light fogging | — | 12 seconds |
| Developing | 37° C. | 95 seconds |
| Bleach-fixing | 35° C. | 45 seconds |
| Stabilizing | 25–30° C. | 90 seconds |
| Drying | 60–85° C. | 40 seconds |

Compositions of the processing solutions
Color developing solution

| Benzyl alcohol | 15.0 ml |
|---|---|
| Ceric sulfate | 0.015 g |
| Ethylene glycol | 8.0 ml |
| Potassium sulfite | 2.5 g |
| Potassium bromide | 0.6 g |
| Sodium chloride | 0.2 g |
| Potassium carbonate | 25.0 g |
| T-1 | 0.1 g |
| Hydroxylamine sulfate | 5.0 g |
| Sodium diethylenetriaminepentaacetate | 2.0 g |
| 4-amino-N-ethyl-N-(β-hydroxyethyl)aniline sulfate | 4.5 g |
| Brightening agent (4,4'-diaminostilbene-disulfonic acid derivative) | 1.0 g |
| Potassium hydroxide | 2.0 g |
| Diethylene glycol | 15.0 ml |
| Water to make | 1000 ml |

The pH was adjusted to 10.15.

Bleach-fixing solution

| Ferric ammonium diethylenetriaminepentaacetate | 90.0 g |
|---|---|
| Diethylenetrimainepentaacetic acid | 3.0 g |
| Ammonium thiosulfate (70% aqueous solution) | 180.0 ml |
| Ammonium sulfite (40% aqueous solution) | 27.5 ml |
| 3-mercapto-1,2,4-triazole | 0.15 g |
| Water to make | 1000 ml. |

The pH was adjusted to 7.1 with potassium carbonate or glacial acetic acid

Stabilizing solution

| O-Phenylphenol | 0.3 g |
|---|---|
| Potassium sulfite (50% aqueous solution) | 12 ml |
| Ethylene glycol | 10.0 g |
| 1-hydroxyethylidene-1,1-diphosphonic acid | 2.5 g |
| Bismuth chloride | 0.2 g |
| Zinc sulfate, heptahydrate | 0.7 g |
| Ammonium hydroxide (28% aqueous solution) | 2.0 g |
| Polyvinylpyrrolidone K-17 | 0.2 g |
| Brightening agent (4,4'-diaminostilbene-disulfonic acid derivative) | 2.0 g |
| Water to make | 1 liter. |

The pH was adjusted to 7.5 with ammonium hydroxide or sulfuric acid. The stabilization treatment was performed using the double bath counterflow system.

The following are the prescriptions of replenishers necessary for conducting a continuous run of processing.
Color developing solution replenisher

| Benzyl alcohol | 18.5 ml |
|---|---|
| Ceric sulfate | 0.015 g |
| Ethylene glycol | 10.0 ml |
| Potassium sulfite | 2.5 g |
| Potassium bromide | 0.3 g |
| Sodium chloride | 0.2 g |
| Potassium carbonate | 25.0 g |
| T-1 | 0.1 g |
| Hydroxylamine sulfate | 5.0 g |
| Sodium diethylenetriaminepentaacetate | 2.0 g |
| 4-Amino-N-ethyl-N-(β-hydroxyethyl) aniline sulfate | 5.4 g |
| Brightening agent (4,42-diaminostilbene-disulfonic acid derivative) | 1.0 g |
| Potassium hydroxide | 2.0 g |
| Diethylene glycol | 18.0 ml |
| Water to make | 1 liter, |

The pH was adjusted to 10.35.

Bleach-fixing solution replenisher
 The same as the foregoing bleach-fixing bath.
Stabilizing solution replenisher
 The same as the foregoing stabilizing bath.

The replenishing rate of each of the developing solution replenisher, bleach-fixing solution replenisher or stabilizing solution replenisher was 320 ml per $m^2$ of photographic material. Using Konsensus 570 available from Konica Corporation, color proofs composed of halftone images were prepared. The processing was continuously conducted until the total amount of color developing solution replenisher replenished reaches an amount that is 3 times the solution amount of the color developing tank.

TABLE 2

| | Density Variation of White Background | | | Small dot Reproducibility* | | | |
|---|---|---|---|---|---|---|---|
| Sample No. | Y | M | C | Y | M | C | BK |
| 1-1 (Comp.) | 0.07 | 0.05 | 0.05 | 6% | 5% | 5% | 5% |
| 1-2 (Comp.) | 0.09 | 0.09 | 0.08 | 5% | 4% | 4% | 4% |
| 1-3 (Comp.) | 0.12 | 0.09 | 0.08 | 4% | 4% | 4% | 4% |
| 1-4 (Comp.) | 0.09 | 0.09 | 0.08 | 6% | 5% | 5% | 5% |
| 1-5 (Comp.) | 0.09 | 0.09 | 0.08 | 6% | 5% | 5% | 5% |
| 1-6 (Inv.) | 0.03 | 0.02 | 0.02 | 4% | 3% | 3% | 3% |
| 1-7 (Inv.) | 0.03 | 0.02 | 0.02 | 4% | 4% | 3% | 3% |

*at the time medium of dots with the dot percentage of 65% being reproduced

As can be seen from Table 2, inventive samples were each low in variation of the white background density, even when the dot percentage of medium dots was varied, and having preferable characteristics in view of superior small dot reproducibility.

Example 2

Samples 2-1 to 2-3 were prepared in a manner similar to Sample 1-6 of Example 1, except that the coverage of the antiirradiation dye (AI-4) used in the 2nd layer was varied so that an unprocessed sample had a reflection density measured at a wavelength of 765 nm, as shown in Table 3. Each sample was processed in the same manner as in Example 1 and obtained images were evaluated with respect to reproducibility of yellow small dots.

TABLE 3

| Sample No. | Reflection Density | Small Dot Reproducibility* Y |
|---|---|---|
| 2-1 | 0.92 | 4% |
| 2-2 | 1.07 | 3.5% |
| 2-3 | 1.15 | 3% |

*: at the time of medium dots with the dot percentage of 65% being reproduced

As can be seen from Table 3, unprocessed samples having a reflection density of not less than 1.0 were superior in the small dot reproducibility.

Example 3

Sample 3-1 was prepared in a manner similar to Sample 2-3 of Example 2, except that cyan coupler, C-100 used the 5th layer was replaced by C-45 with a coverage of 0.24 g/m². Samples were each processed and evaluated in the same manner as in Example 1. Results thereof are shown in Table 4.

TABLE 4

| Sample No. | Density Variation of White Background | | | Small dot Reproducibility* | | | |
|---|---|---|---|---|---|---|---|
| | Y | M | C | Y | M | C | BK |
| 2-3 (Inv.) | 0.03 | 0.02 | 0.02 | 3% | 3% | 3% | 3% |
| 3-1 (Inv.) | 0.03 | 0.02 | 0.00 | 3% | 3% | 2% | 3% |

*at the time of medium dots with the dot percentage of 65% being reproduced

As can be seen from Table 4, the use of the cyan coupler preferably used in the invention led to an improvement in the white background variation and small dot reproducibility.

What is claimed is:

1. A silver halide light sensitive color photographic material comprising a reflective support comprising a base paper provided on each side thereof with a polyolefin resin coat layer having on one side of the support a hydrophilic colloid layer containing a white pigment and one or more silver halide emulsion layers, wherein a silver halide emulsion layer closest to the support contains a silver halide emulsion having a spectral sensitivity maximum at a wavelength of 730 nm or more, and titanium dioxide as the said white pigment having an average primary particle size of 0.32 to 1.0 μm, the polyolefin resin coat layer on the silver halide emulsion side containing titanium dioxide, and wherein said photographic material further comprises a blue-sensitive silver halide emulsion, a green-sensitive silver halide emulsion and a red-sensitive silver halide emulsion.

2. The photographic material of claim 1, wherein a reflection density of the photographic material is 1.0 or more at a wavelength of a spectral sensitivity maximum of a silver halide emulsion contained in at least one of the silver halide emulsion layers.

3. The photographic material of claim 2, wherein the wavelength of the spectral sensitivity maximum is 730 nm or more.

4. The photographic material of claim 1, wherein said photographic material comprises a silver halide emulsion used for forming a yellow image, a silver halide emulsion used for forming a magenta image, a silver halide emulsion used for forming a cyan image and a silver halide emulsion used for forming a black image.

5. The photographic material of claim 1, wherein at least one silver halide emulsion layer comprises a compound represented by the following formulas [I] to [IV]:

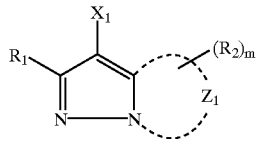

Formula [I]

wherein $R_1$ represents a hydrogen atom or a substituent; $R_2$ represents a substituent; m represents the number of the substituent $R_2$, provided that when m is 0, $R_1$ is an electron-withdrawing group having a Hammett's substituent constant σp of 0.20 or more and when m is 1 or more, at least one of $R_1$ and $R_2$ is an electron-withdrawing group having a Hammett's substituent constant σp of 0.20 or more; Z, represents a non-metallic atom group necessary for forming a nitrogen-containing 5-membered heterocyclic ring; $X_1$ represents a hydrogen atom or a group capable of being released upon coupling reaction with an oxidation product of a color developing agent;

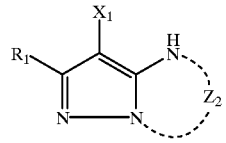

Formula [II]

wherein $R_3$ represents a hydrogen atom or a substituent; $Z_2$ represents a non-metallic atom group necessary for forming a nitrogen-containing 6-membered heterocyclic ring with —NH— through condensing with the pyrazole ring; $X_2$ represents a hydrogen atom or a group capable of being released upon coupling reaction with an oxidation product of a color developing agent;

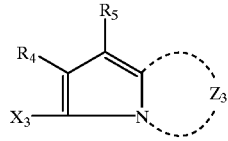

Formula [III]

wherein $R_4$ and $R_5$ each represent an electron-withdrawing group having a Hammett's substituent constant σp of 0.20 or more, provided that a sum of σp values of $R_4$ and $R_5$ is 0.65 or more; $Z_3$ represents a non-metallic atom group necessary for forming a nitrogen-containing 5-membered heterocyclic ring; $X_3$ represents a hydrogen atom or a group capable of being released upon coupling reaction with an oxidation product of a color developing agent;

Formula [IV]

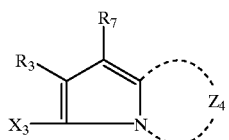

wherein $R_6$ and $R_7$ each represent a hydrogen atom or a substituent, $Z_4$ represents a non-metallic atom group necessary for forming a nitrogen-containing 6-membered heterocyclic ring; and $X_4$ represents a hydrogen atom or a group capable of being released upon coupling reaction with an oxidation product of a color developing agent.

6. A silver halide light sensitive color photographic material comprising a reflective support comprising a base paper provided on each side thereof with a polyolefin resin coat layer having on one side of the support a hydrophilic colloid layer containing a white pigment and one or more silver halide emulsion layers, wherein a silver halide emulsion layer closest to the support contains a silver halide emulsion having a spectral sensitivity maximum at a wavelength of 730 nm or more, and titanium dioxide as the said white pigment having an average primary particle size of 0.32 to 1.0 μm, the polyolefin resin coat layer on the silver halide emulsion side containing titanium dioxide, and wherein said photographic material comprises a silver halide emulsion used for forming a yellow image, a silver halide emulsion used for forming a magenta image, a silver halide emulsion used for forming a cyan image and a silver halide emulsion used for forming a black image.

7. The photographic material of claim 6, wherein a reflection density of the photographic material is 1.0 or more at a wavelength of a spectral sensitivity maximum of a silver halide emulsion contained in at least one of the silver halide emulsion layers.

8. The photographic material of claim 7, wherein the wavelength of the spectral sensitivity maximum is 730 nm or more.

9. The photographic material of claim 6, wherein at least one silver halide emulsion layer comprises a compound represented by the following formulas (I) to (IV):

Formula (I)

Formula [I]

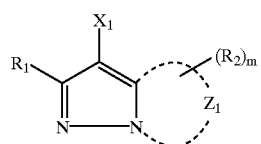

wherein $R_1$ represents a hydrogen atom or a substituent; $R_2$ represents a substituent; m represents the number of the substituent $R_2$, provided that when m is 0, $R_1$ is an electron-withdrawing group having a Hammett's substituent constant σp of 0.20 or more and when m is 1 or more, at least one of $R_1$ and $R_2$ is an electron-withdrawing group having a Hammett's substituent constant σp of 0.20 or more; $Z_1$ represents a non-metallic atom group necessary for forming a nitrogen-containing 5-membered heterocyclic ring; $X_1$ represents a hydrogen atom or a group capable of being released upon coupling reaction with an oxidation product of a color developing agent;

Formula (II)

Formula [II]

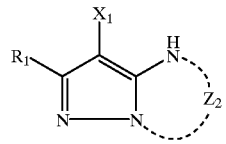

wherein $R_3$ represents a hydrogen atom or a substituent; $Z_2$ represents a non-metallic atom group necessary for forming a nitrogen-containing 6-membered heterocyclic ring with —NH— through condensing with the pyrazole ring; $X_2$ represents a hydrogen atom or a group capable of being released upon coupling reaction with an oxidation product of a color developing agent;

Formula (III)

Formula [III]

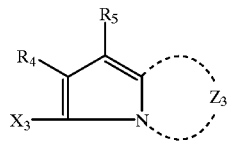

wherein $R_4$ and $R_5$ each represent an electron-withdrawing group having a Hammett's substituent constant σp of 0.20 or more, provided that a sum of σp values of $R_4$ and $R_5$ is 0.65 or more; $Z_3$ represents a non-metallic atom group necessary for forming a nitrogen-containing 5-membered heterocyclic ring; $X_3$ represents a hydrogen atom or a group capable of being released upon coupling reaction with an oxidation product of a color developing agent;

Formula (IV)

Formula [IV]

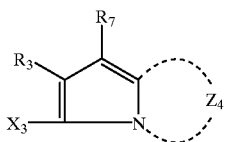

wherein $R_6$ and $R_7$ each represent a hydrogen atom or a substituent, $Z_4$ represents a non-metallic atom group necessary for forming a nitrogen-containing 6-membered heterocyclic ring; and $X_4$ represents a hydrogen atom or a group capable of being released upon coupling reaction with an oxidation product of a color developing agent.

* * * * *